United States Patent
Kitamura

(10) Patent No.: US 10,468,510 B2
(45) Date of Patent: Nov. 5, 2019

(54) SEMICONDUCTOR DEVICE AND MANUFACTURING METHOD OF THE SAME

(71) Applicant: FUJI ELECTRIC CO., LTD., Kawasaki-shi, Kanagawa (JP)

(72) Inventor: Mutsumi Kitamura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 117 days.

(21) Appl. No.: 15/206,884

(22) Filed: Jul. 11, 2016

(65) Prior Publication Data

US 2017/0018637 A1 Jan. 19, 2017

(30) Foreign Application Priority Data

Jul. 16, 2015 (JP) .................................. 2015-142106
May 12, 2016 (JP) .................................. 2016-096387

(51) Int. Cl.
*H01L 29/739* (2006.01)
*H01L 29/06* (2006.01)
(Continued)

(52) U.S. Cl.
CPC ...... *H01L 29/7397* (2013.01); *H01L 29/0623* (2013.01); *H01L 29/0634* (2013.01);
(Continued)

(58) Field of Classification Search
CPC combination set(s) only.
See application file for complete search history.

(56) References Cited

U.S. PATENT DOCUMENTS

| 6,184,555 | B1 | 2/2001 | Tihanyi et al. |
| 6,274,904 | B1 | 8/2001 | Tihanyi |

(Continued)

FOREIGN PATENT DOCUMENTS

| JP | 2000-101082 | 4/2000 |
| JP | 2000-504879 | 4/2000 |

(Continued)

OTHER PUBLICATIONS

M. Antoniou et al., "Experimental demonstration of the p-ring FS+Trench IGBT concept: A new design for minimizing the conduction losses", *Symposium on Power Semiconductor Devices & IC's*, Kowloon Shangri-La, HongKong, May 10-14, 2015, pp. 21-24.

*Primary Examiner* — Ratisha Mehta

(57) ABSTRACT

A semiconductor device includes: a drift layer of a first conductivity type, implementing a main semiconductor layer; a base region of a second conductivity type provided on an top surface side of the drift layer; a first main electrode region of the first conductivity type provided in an upper part of the base region, having an impurity concentration higher than the main semiconductor layer; a gate electrode buried in a trench penetrating the first main electrode region and the base region through a gate insulating film; a gate screening semiconductor layer of the second conductivity type, being buried under a bottom of the trench; an intermediate semiconductor layer of the first conductivity type sandwiched between the base region and the gate screening semiconductor layer; and a second main electrode region of the second conductivity type provided on a bottom surface side of the drift layer.

15 Claims, 26 Drawing Sheets

(51) Int. Cl.
   *H01L 29/66* (2006.01)
   *H01L 21/225* (2006.01)

(52) U.S. Cl.
   CPC .... *H01L 29/66348* (2013.01); *H01L 21/2253* (2013.01); *H01L 29/0619* (2013.01)

(56) References Cited

U.S. PATENT DOCUMENTS

| | | | |
|---|---|---|---|
| 6,373,890 B1 | 4/2002 | Freeman | |
| 6,646,304 B1 | 11/2003 | Tihanyi et al. | |
| 2007/0114598 A1* | 5/2007 | Hotta | H01L 29/0619 |
| | | | 257/330 |
| 2014/0231909 A1* | 8/2014 | Willmeroth | H01L 29/0634 |
| | | | 257/339 |
| 2015/0221731 A1* | 8/2015 | Zeng | H01L 29/407 |
| | | | 257/139 |
| 2016/0359026 A1* | 12/2016 | Matsuura | H01L 29/7397 |

FOREIGN PATENT DOCUMENTS

| | | | |
|---|---|---|---|
| JP | 2001-313393 | 11/2001 | |
| JP | 2002-503401 | 1/2002 | |
| JP | 2002-511657 | 4/2002 | |
| JP | 2016225566 A * | 12/2016 | H01L 29/7397 |

* cited by examiner

SEMICONDUCTOR DEVICE AND MANUFACTURING METHOD OF THE SAME

CROSS-REFERENCE TO RELATED APPLICATIONS

This application claims benefit of priority under 35 USC 119 based on Japanese Patent Applications No. 2015-142106 filed Jul. 16, 2015 and No. 2016-096387 filed May 12, 2016, the entire contents of which are incorporated by reference herein.

BACKGROUND

The present invention relates to semiconductor devices and methods of manufacturing the semiconductor devices.

As earlier semiconductor devices such as insulating gate bipolar transistors (IGBTs), the structure encompassing an n-type semiconductor region at the corner portion in the periphery of a semiconductor device is known, the corner portion is implemented by island-, wedge-, or layer-formed p-type floating regions, to improve the breakdown voltage at the corner portion (see JP2002-503401A1). There is another known structure in which an n-type semiconductor layer includes a p-type buried layer having an elliptic cross-sectional shape for improvements in breakdown voltage, turn-on speed, and the like (see JP2001-313393A).

Semiconductor chips of earlier IGBTs are being increasingly thinned in order to decrease on-state-voltage and turn-off power loss. However, the thinning of semiconductor chips is limited by restrictions of manufacturing processes. Therefore, the decrease of the turn-off power loss without increasing the on-state-voltage is difficult.

In the light of the aforementioned problems, an object of the present invention is to provide a semiconductor device having a decreased turn-off power loss with a smaller on-state-voltage, and to provide a method of manufacturing the semiconductor device having the same performances.

SUMMARY

An aspect of the present invention inheres in a semiconductor device is provided, including: (a) a drift layer of a first conductivity type, implementing a main semiconductor layer; (b) a base region of a second conductivity type provided on an top surface side of the drift layer; (c) a first main electrode region of the first conductivity type provided in an upper part of the base region, having an impurity concentration higher than the main semiconductor layer; (d) a gate insulating film buried in a trench penetrating the first main electrode region and the base region; (e) a gate electrode buried in the trench through the gate insulating film; (f) a gate screening semiconductor layer of the second conductivity type, being buried under a bottom of the trench; (g) an intermediate semiconductor layer of the first conductivity type sandwiched between the base region and the gate screening semiconductor layer; and (h) a second main electrode region of the second conductivity type provided on a bottom surface side of the drift layer.

Another aspect of the present invention inheres in a semiconductor device is provided, including: (a) a drift layer implemented by a stacked structure including a plurality of main semiconductor layers of a first conductivity type located at least in upper and bottom surfaces of the drift layer, and an auxiliary semiconductor layer of a second conductivity sandwiched between the plurality of main semiconductor layers; (b) a first main electrode region of the first conductivity type provided on an top surface side of the drift layer and having an impurity concentration higher than the main semiconductor layer; (c) a second main electrode region of the second conductivity type provided on a bottom surface side of the drift layer; and (d) a carrier control structure configured to control movement of carriers being transported in the drift layer.

Still another aspect inheres in a method of manufacturing a semiconductor device is provided, including: (a) forming a base region of a second conductivity type on an top surface side of a drift layer including a main semiconductor layer of a first conductivity; (b) forming a first main electrode region of the first conductivity type in an upper part of the base region, the first main electrode region having an impurity concentration higher than the main semiconductor layer; (c) digging a trench penetrating the first main electrode region and the base region; (d) forming a gate insulating film in the trench; (e) burying a gate electrode in the trench through the gate insulating film; (f) forming a gate screening semiconductor layer of the second conductivity type so as to be buried under a bottom of the trench; (g) forming an intermediate semiconductor layer of the first conductivity type sandwiched between the base region and the gate screening semiconductor layer; and (h) forming a second main electrode region of the second conductivity type on a bottom surface side of the drift layer.

Still another aspect inheres in a method of manufacturing a semiconductor device is provided, including: (a) sandwiching an auxiliary semiconductor layer of a second conductivity between a plurality of main semiconductor layers of a first conductivity type to form a drift layer implemented by a stacked structure including the plurality of main semiconductor layers and the auxiliary semiconductor layer, the plurality of main semiconductor layers located at least in upper and bottom surfaces of the drift layer; (b) forming a first main electrode region of the first conductivity type on the top surface side of the drift layer, the first main electrode region having an impurity concentration higher than the plurality of main semiconductor layers; (c) forming a carrier control structure configured to control movement of carriers being transported in the drift layer; and (d) forming a second main electrode region of the second conductivity type on the bottom surface side of the drift layer.

DETAILED DESCRIPTION OF THE INVENTION

Figure 1:
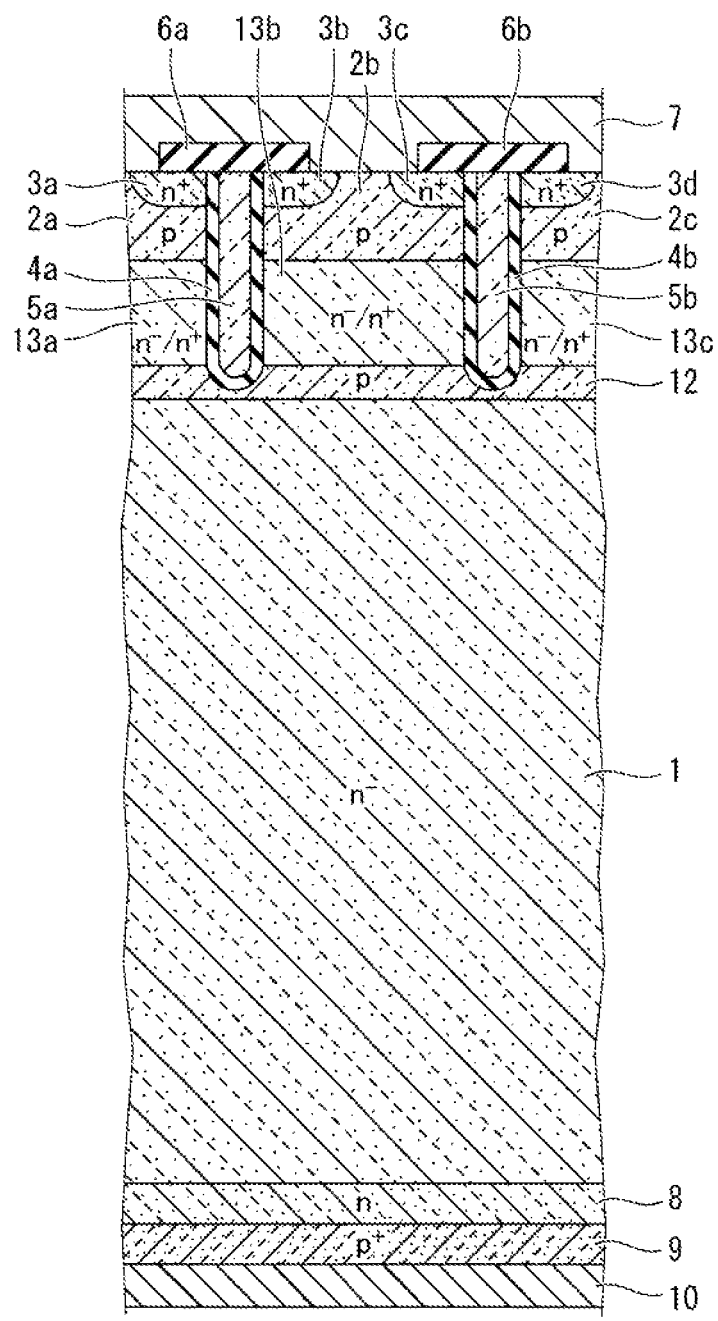
FIG. 1 is a cross-sectional view illustrating an example of the configuration of a semiconductor device according to a first embodiment of the present invention.

With reference to the drawings, first to third embodiments of the present invention will be explained in detail below. In the following description of the drawings, the same or similar reference numerals are assigned to the same or similar portions. The drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. Moreover, the first to third embodiments shown below exemplifies devices and methods for embodying the technical ideas of the present invention. The technical ideas of the present invention do not specify the materials of the constituent components and the shape, structure, and arrangement thereof to those described below. The technical idea of the present invention can be variously changed without departing from the technical scope prescribed by the claims.

In the specification, a "first main electrode region" refers to a region which serves as any one of emitter and collector regions in the case of IGBTs. Alternatively, the "first main electrode region" may refer to a region which serves as any one of anode and cathode regions in static induction thyristors (SI thyristors) or gate turn-off thyristors (GTO). A "second main electrode region" refers to a region which serves as any one of emitter and collector regions that is not the first main electrode region in IGBTs and also refers to a region which serves as any one of anode and cathode regions that is not the first main electrode region in SI thyristors and GTOs. In other words, when the first main electrode region is the emitter region, the second main electrode region is the collector region. When the first main electrode region is the anode region, the second main electrode region is the cathode region.

In this specification, a "first conductivity-type" refers to any one of p-type and n-type, and a "second conductivity-type" refers to the conductivity type opposite to the first conductivity-type. In the semiconductor devices pertaining to the first to third embodiments, which will be described below, the first and second conductivity types are respectively assigned to n-type and p-type, but this is a matter of choice. When the first and second conductivity types are p-type and n-type, respectively, the technical idea and effectiveness of the present invention can be achieved similarly by inverting the polarity in the following description. The present invention does not need to be limited to the choice of the conductivity type used in the following description. In the specification and accompanying drawings, the majority carriers are electrons or holes in n and p labeled layers or regions, respectively. Superscripts + and − labeled to n and p mean that semiconductor regions with + or − have higher impurity concentration than that of semiconductor regions without + or −.

In the specification, definitions of "top" and "bottom" of a top surface, a bottom surface, and the like are just a matter of expression on an illustrated cross-sectional view. For example, when the orientation of the semiconductor device is changed by 90 degrees, the references "top" and "bottom" shall correspond to left and right, and when the orientation of the semiconductor device is changed by 180 degrees, the relationship between the "top" and "bottom" shall be reversed.

First Embodiment

<Structure of Semiconductor Device>

As a semiconductor device according to a first embodiment of the present invention, an IGBT having a trench-gate structure is described. The element area (the active area) of the semiconductor device according to the first embodiment of the present invention includes a drift layer (a main semiconductor layer) 1 of a first conductivity type (n−-type) as illustrated in FIG. 1. The drift layer 1 has a thickness of about 50 µm to 60 µm, for example and an impurity concentration of about $0.7 \times 10^{13}$ cm$^{-3}$, for example.

The semiconductor device according to the first embodiment of the present invention includes a carrier control structure configured to control the movement of carriers being transported in the drift layer 1. The carrier control structure includes base regions 2a to 2c of a second conductivity type (p-type), gate insulating films 4a and 4b, and gate electrodes 5a and 5b. The base regions 2a to 2c are established on the top surface side of the drift layer 1. The gate insulating films 4a and 4b are provided within trenches (recesses) penetrating the base regions 2a to 2c. Each trench has a width of about 1 µm and has a depth of about 3 µm, for example. The distance between centers of adjacent trenches is about 2.5 µm. The gate electrodes 5a and 5b are buried in the trenches with the gate insulating films 4a and 4b interposed between the gate electrodes 5a and 5b and the trenches. The gate electrodes 5a and 5b electrostatically control the potential in the base regions 2a to 2c, configured to control movement of carriers being injected into the drift layer 1 via the base regions 2a to 2c.

In the upper part of the base regions 2a to 2c, first main electrode regions (emitter regions) 3a to 3d of the first conductivity type (n+-type) are selectively established. The emitter regions 3a to 3d have an impurity concentration higher than the drift layer 1. The emitter regions 3a to 3d are in contact with the gate electrodes 5a and 5b through the gate insulating films 4a and 4b, respectively.

On the top surface of the drift layer 1, a gate screening semiconductor layer 12 of the second conductivity type (p-type) is buried so as to surround bottoms of the plurality of trenches (in other words, so as to integrally surround the bottoms of the plurality of trenches). The gate screening semiconductor layer 12 is uniformly buried on the major surface of the drift layer 1. The gate screening semiconductor layer 12 is in contact with the plurality of gate insulating films 4a and 4b so as to sheathe the bottoms of the plurality of gate insulating films 4a and 4b. The thickness of the gate screening semiconductor layer 12 is about 2 µm, for example, and the impurity concentration of the gate screening semiconductor layer 12 is about $2 \times 10^{14}$ cm$^{-3}$, for example.

Intermediate semiconductor layers 13a to 13c of the first conductivity type (n−-type or n+-type) are buried between the base regions 2a to 2c and the gate screening semiconductor layer 12. The impurity concentration of the intermediate semiconductor layers 13a to 13c is equal to or higher than that of the drift layer 1. The intermediate semiconductor layers 13a to 13c are buried in contact with the gate insulating films 4a and 4b located on the adjacent side surfaces of trenches.

Since the gate screening semiconductor layer 12 sheathes the bottom surfaces of the plurality of trenches, it is necessary to inject electrons into the drift layer 1. The intermediate semiconductor layers 13a to 13c of the first conductivity type, which are in contact with the gate insulating films 4a and 4b located on the trench side surfaces, need to be provided between the p-type base regions 2a to 2c and the gate screening semiconductor layer 12. Inversion-layer channels formed in the base regions 2a to 2c are connected to accumulation-layer channels in the intermediate semiconductor layers 13a to 13c. This allows some of electrons in the accumulation-layer channels to diffuse into the intermediate semiconductor layers 13a to 13c.

The impurity concentration of the gate screening semiconductor layer 12 has the same order of magnitude as that of the drift layer 1 or intermediate semiconductor layer 13a to 13c or is an order of magnitude higher. Electrons having diffused into the intermediate semiconductor layers 13a to 13c diffuse into the drift layer 1 through the gate screening semiconductor layer 12. The semiconductor device in which the p-type gate screening semiconductor layer 12 uniformly sheathes the bottoms of the trenches can be therefore turned on.

An emitter electrode 7 is laminated on the gate electrodes 5a and 5b through the interlayer insulating films 6a and 6b so as to be separated from gate wiring (not illustrated) located at a rearward portion of the paper in the depth-direction. The emitter electrode 7 is in contact with the emitter regions 3a to 3d and base regions 2a to 2c. The emitter electrode 7 and gate wiring can be made by aluminum (Al) or aluminum alloy such as Al-silicon (Si), Al-copper (Cu), or Al—Cu—Si, for example.

In the bottom surface side of the drift layer 1, a second main electrode region (a collector region) 9 of the second conductivity type (p+-type) is established. An n-type field stop (FS) layer 8 is buried between the drift layer 1 and collector region 9. The n-type FS layer 8 has an impurity concentration higher than that of the drift layer 1. A collector electrode 10 is laminated on the bottom surface of the collector region 9. The collector electrode 10 can be implemented by a single-layer film made by gold (Au) or a composite metallic film stacked by Al, nickel (Ni), and Au in this order, for example, or alternatively, the collector electrode 10 may further include a metallic plate made by molybdenum (Mo), tungsten (W), or the like provided as the bottom layer of composite structure.

With the semiconductor device according to the first embodiment of the present invention, the gate screening semiconductor layer 12 is uniformly sheathed to surround the bottoms of the plurality of trenches. Therefore, the turn-off power loss can be decreased, while preventing the increase of the on-state-voltage, improving the breakdown voltage. Although the earlier IGBTs have problems of low switching speed due to a rise in gate voltage at switching, by the semiconductor device according to the first embodiment of the present invention, because the gate screening semiconductor layer 12 screens the bottoms of the plurality of trenches so as to relax the electric field at the bottoms of the plurality of trenches, the rise in gate voltage can be decreased at switching, and therefore the switching speed can be increased.

<Manufacturing Method of Semiconductor Device>

Next, with reference to FIG. 2A to FIG. 4C, an example of the method of manufacturing the semiconductor device according to the first embodiment of the present invention will be explained. The method of manufacturing a semiconductor device described below is just an example. It is obvious that the present invention can be produced by other various manufacturing methods including the modifications without departing from the scope of the claims.

Figure 2A:
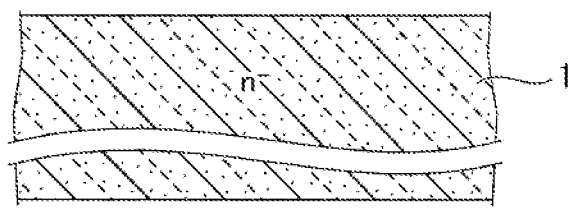
FIGS. 2A and 2B are cross-sectional process views for explaining an example of a method of manufacturing a semiconductor device according to the first embodiment of the present invention.
Figure 2B:
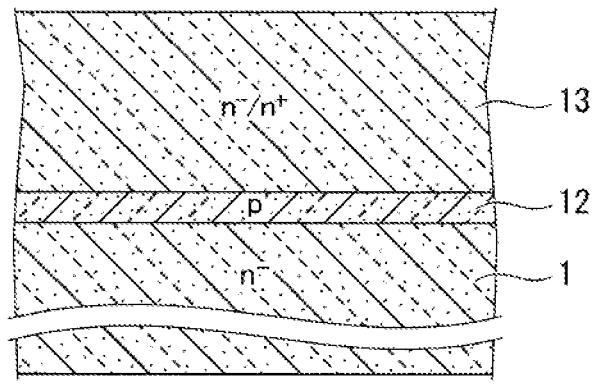

(a) As illustrated in FIG. 2A, an n⁻-type semiconductor substrate 1 is prepared, which is made by a single crystal Si or the like, having an impurity concentration of about $7\times10^{13}$ cm$^{-3}$. In the surface of the semiconductor substrate 1, p-type impurity ions, such as boron (B) ions, are implanted with a dose amount such that the established impurity concentration can be about $2\times10^{14}$ cm$^{-3}$ after activation. Thereafter, as illustrated in FIG. 2B, an n⁻-type intermediate semiconductor layer 13 with an impurity concentration of $7\times10^{13}$ cm$^{-3}$ is epitaxially grown to a thickness of about 10 μm on the semiconductor substrate 1. The p-type impurity ions implanted in the surface of the semiconductor substrate 1 are activated due to heat treatment at the epitaxial growth of the intermediate semiconductor layer 13, a part of the active p-type impurity ions are compensated by the n-type impurity atoms of the epitaxial layer. The p-type gate screening semiconductor layer 12 with an impurity concentration of about $1.3\times10^{13}$ cm$^{-3}$ is thus formed to a thickness of about 2 μm between the semiconductor substrate 1 and intermediate semiconductor layer 13.

Figure 3A:
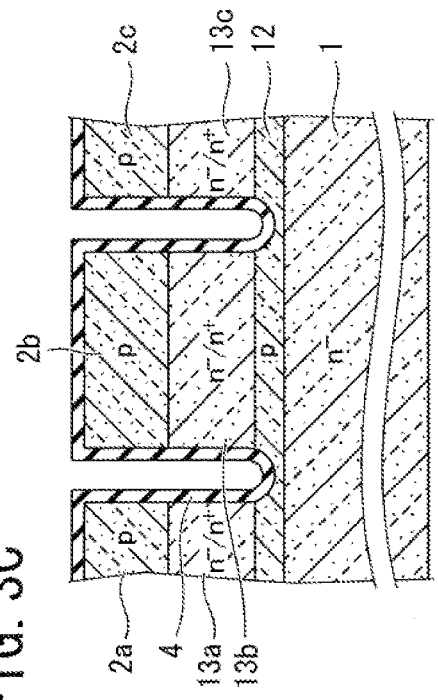
FIGS. 3A to 3D are cross-sectional process views subsequent to FIGS. 2A and 2B for explaining the example of the method of manufacturing a semiconductor device according to the first embodiment of the present invention.

(b) Next, p-type impurity ions, such as B ions, are implanted in the surface of the intermediate semiconductor layer 13 with a predetermined projected range. Subsequently, heat treatment is performed to activate the implanted ions, forming a p-type base region 2 with an impurity concentration of $1\times10^{15}$ cm$^{-3}$ to $1\times10^{17}$ cm$^{-3}$, for example, as illustrated in FIG. 3A. Instead of forming the base region 2 by ion implantation, the base region 2 may be epitaxially grown on the top surface of the intermediate semiconductor layer 13.

Figure 3B:
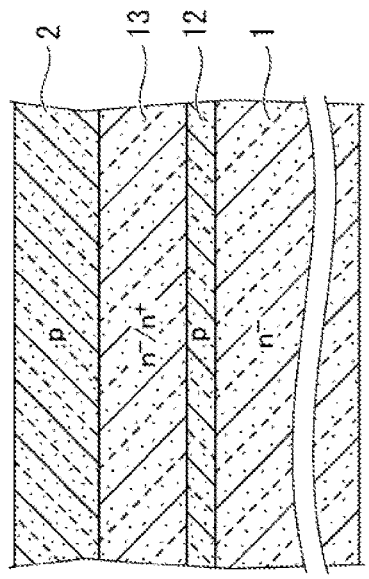

(c) Next, a photoresist film 21 is coated onto the base region 2 and is delineated by photolithography. Using the delineated photoresist film 21 as a mask, recesses (trenches) 2x and 2y, which penetrate the base region 2 and intermediate semiconductor layer 13 and reach the gate screening semiconductor layer 12, are selectively formed as illustrated in FIG. 3B by dry etching such as reactive ion etching (RIE). The photoresist film 21 is then removed by oxygen (O₂) plasma or the like. Alternatively, the trenches 2x and 2y may be entrenched after forming an oxide film on the intermediate semiconductor layer 13, delineating the oxide film using the photoresist film 21, by the dry etching using the delineated oxide film as a mask.

Figure 3C:
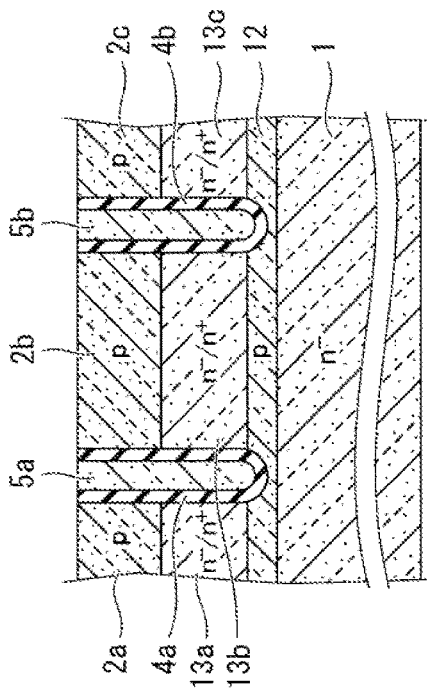
Figure 3D:
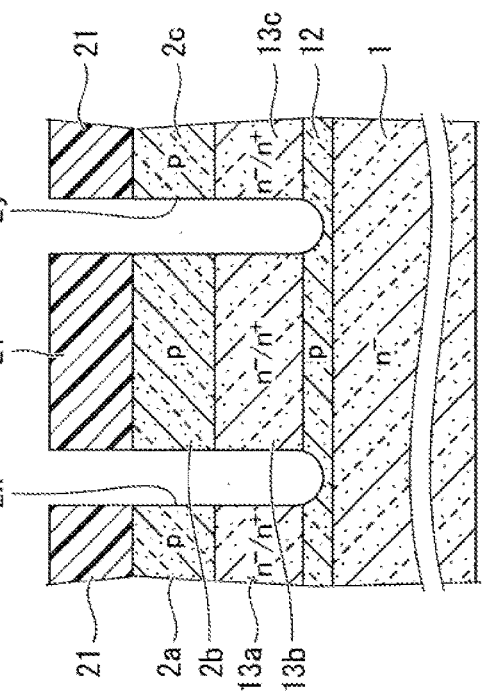

(d) Next, a gate insulating film 4 made by silicon oxide film (SiO₂ film) is formed on the base regions 2a to 2c and the inner surfaces of the trenches 2x and 2y by thermal oxidation or the like as illustrated in FIG. 3C. On the gate insulating film 4, a polysilicon layer doped with n-type impurity ions is deposited by chemical vapor-phase deposition (CVD) or the like. The doped polysilicon layer is etched back so that the doped polysilicon layers 5a and 5b are buried in the trenches 2x and 2y through the gate insulating films 4a and 4b. The gate insulating film 4 is selectively removed by dry etching or the like using the selectivity, or the etching rate ratio of polysilicon against the oxide film so as to expose the top surfaces of the base regions 2a to 2c as illustrated in FIG. 3D.

Figure 4C:
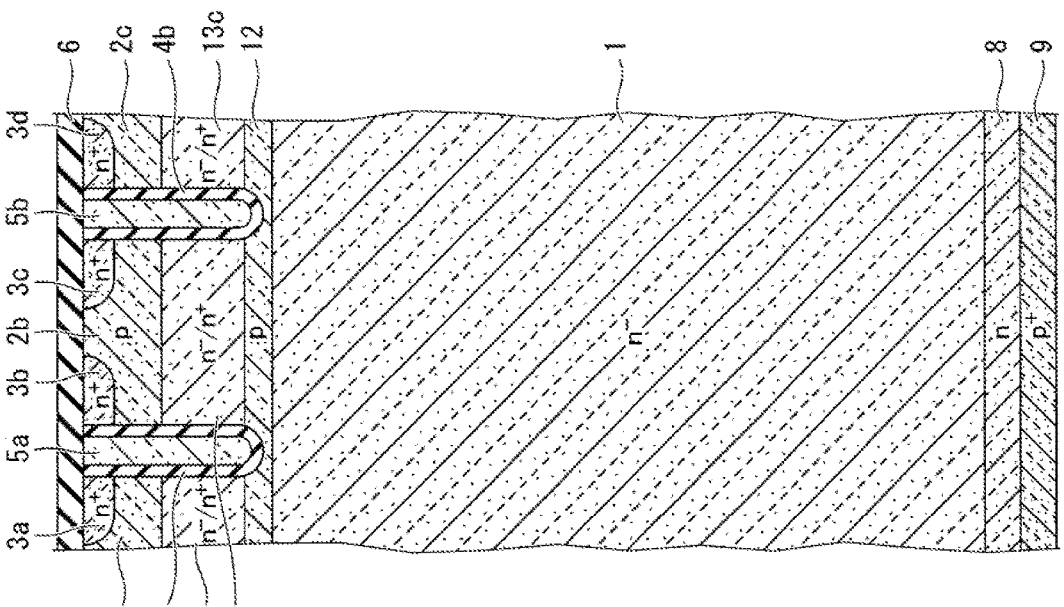
FIGS. 4A to 4C are cross-sectional process views subsequent to FIGS. 3A to 3D for explaining the example of the method of manufacturing a semiconductor device according to the first embodiment of the present invention.
Figure 4A:
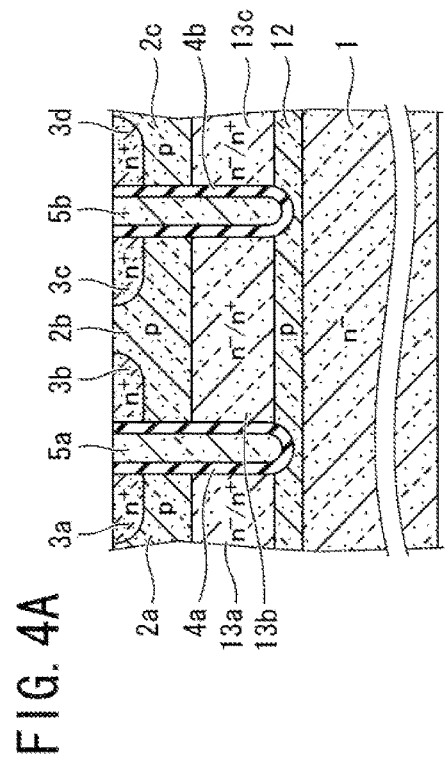
Figure 4B:
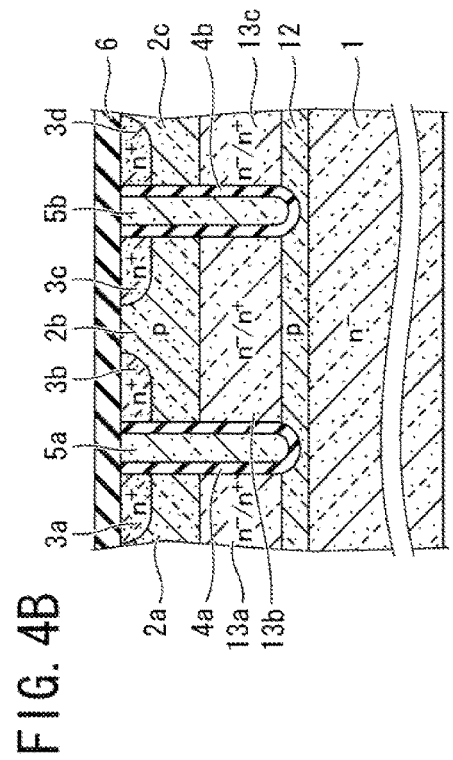

(e) Next, photoresist film (not illustrated) is coated onto the base regions 2a to 2c and is delineated by photolithography. Using the delineated photoresist film as a mask, n-type impurity ions, such as As or P ions, are implanted. Simultaneously, the ions are also implanted into the polysilicon layers 5a and 5b. The photoresist film is removed by O₂ plasma or the like. Subsequent heat treatment activates the implanted ions. As illustrated in FIG. 4A, the n⁺-type emitter regions 3a to 3d with an impurity concentration of about $5\times10^{19}$ cm$^{-3}$ to $1\times10^{21}$ cm$^{-3}$, for example, are thus selectively formed in upper part of the base regions 2a to 2c. In the process of heating the emitter regions 3a to 3d, the ions implanted into the polysilicon layers 5a and 5b are also activated. Moreover, as illustrated in FIG. 4B, an interlayer insulating film 6 made by SiO₂ film or the like is deposited on the gate electrodes 5a and 5b, the emitter regions 3a to 3d, and the base regions 2a to 2c.

(f) Next, the bottom surface of the semiconductor substrate 1 is polished (or ground if necessary) and etched to adjust the thickness of the semiconductor substrate 1. After the adjustment of thickness, n-type and p-type impurity ions are sequentially implanted from the bottom surface of the semiconductor substrate 1 with a predetermined projected range. Thereafter, heat treatment is performed to activate the implanted ions. As illustrated in FIG. 4C, the n-type FS layer 8 and the p⁻-type collector region 9 with an impurity concentration of about $3\times10^{18}$ cm$^{-3}$ to $1\times10^{20}$ cm$^{-3}$, for example, are thus formed in the bottom surface side of the semiconductor substrate 1.

(g) Next, photoresist film (not illustrated) is coated on the interlayer insulating film 6 and is then delineated using photolithography. Using the delineated photoresist film as a mask, the interlayer insulating film 6 is selectively etched so that the interlayer insulating film 6 is selectively remain on the gate electrodes 5a and 5b, other than the areas for gate contact holes by dry etching, and that emitter and gate contact holes can be opened. The photoresist film is then removed by O₂ plasma or the like.

(h) Next, after metallic film made by Al or the like is deposited by sputtering or vacuum evaporation, new photoresist film is coated. Using photolithography, the emitter electrode 7 is formed on the top surfaces of the emitter regions 3a to 3d and the base regions 2a to 2c as illustrated in FIG. 1, and the gate wiring (not illustrated) located at a rearward portion of the paper is simultaneously delineated. In a similar manner, the collector electrode 10 made by Au or the like is formed on the bottom surface of the collector region 9 by sputtering, vacuum evaporation or the like. If necessary, the bottom surface of the drift layer 1 is irradiated with electron beams or protons. Therefore, crystalline defects for controlling the lifetime of carriers can be generated in the drift layer 1. Subsequent heat treatment recovers the crystalline defects unstable in energy. The semiconductor device according to the first embodiment of the present invention is thus completed.

With the method of manufacturing a semiconductor device according to the first embodiment of the present invention, it is possible to manufacture a semiconductor device which has a decreased turn-off power loss while preventing the increase of the on-state-voltage, and having an improved breakdown voltage.

<First Modification>

Figure 5:
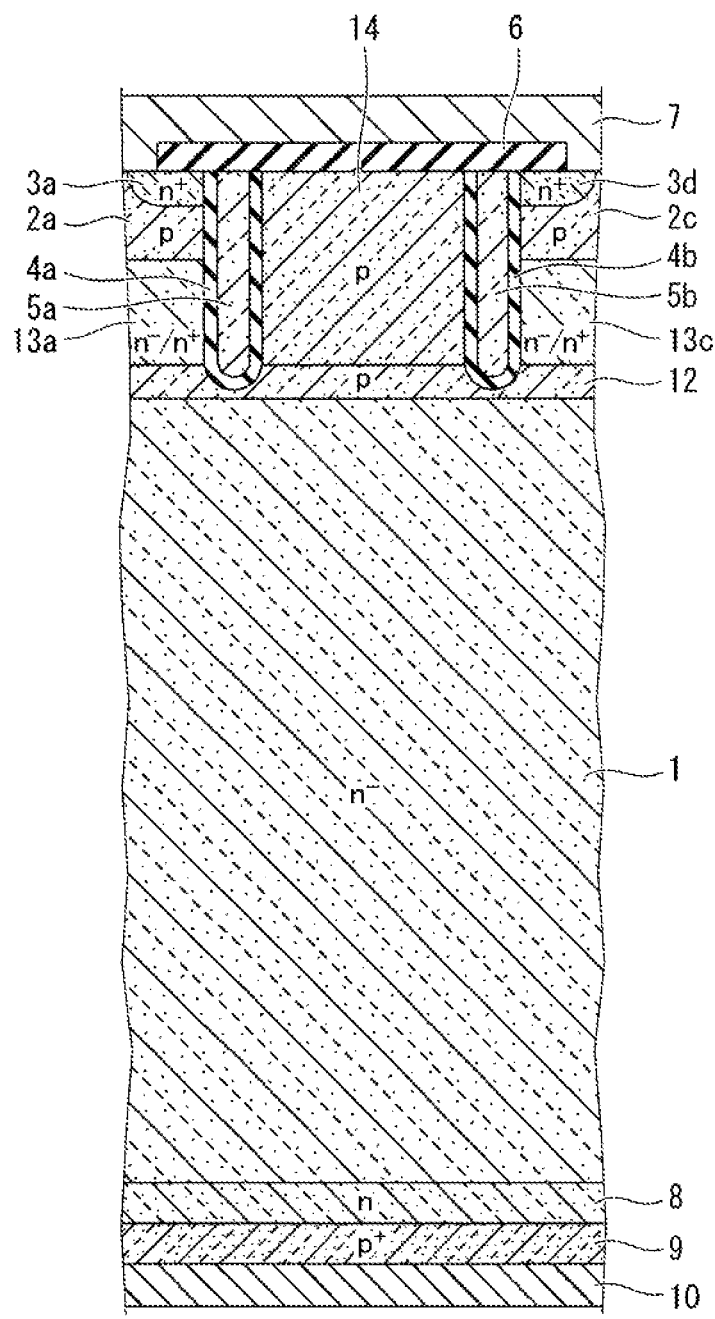
FIG. 5 is a cross-sectional view illustrating an example of the configuration of a semiconductor device according to a first modification of the first embodiment of the present invention.

FIG. 5 illustrates the configuration of a semiconductor device according to a first modification of the first embodiment of the present invention. The semiconductor device according to the first modification of the first embodiment of the present invention is different from that of the first embodiment of the present invention illustrated in FIG. 1 in that a part of the mesa region between adjacent trenches constitutes a p-type mesa region 14 with the surface covered with insulating film. The top surface of the p-type mesa region 14 is covered with the interlayer insulating film 6. The bottom surface of the p-type mesa region 14 is in contact with the gate screening semiconductor layer 12. By providing the p-type mesa region 14, holes accumulated in the p-type mesa region 14 flow through the gate screening semiconductor layer 12 to the contact at turn on or turn on off. Therefore, influence of holes on the potential of the gate electrodes 5a and 5b can be suppressed. The p-type mesa region 14 may be electrically floating. Alternatively, the interlayer insulating film 6, which covers the p-type mesa region 14, is partially opened for electric connection between the p-type mesa region 14 and the emitter electrode 7.

The p-type mesa region 14 may be formed by selectively implanting a p-type impurity ions, such as B ions, in the surface of the intermediate semiconductor layer 13 illustrated in FIG. 2B, followed by heat treatment, for example.

With the first modification of the first embodiment of the present invention, similarly to the first embodiment of the present invention, inclusion of the gate screening semiconductor layer 12, which is uniformly buried to sheathe the bottoms of the plurality of trenches, can decrease the turn-off power loss with gate voltage prevented from increasing and also improve the breakdown voltage. Moreover, the gate screening semiconductor layer 12 sheathes the bottoms of the plurality of trenches so as to relax the electric field at the bottoms of the plurality of trenches, the rise in gate voltage can be suppressed at switching, and the switching speed can be increased.

Figure 6:
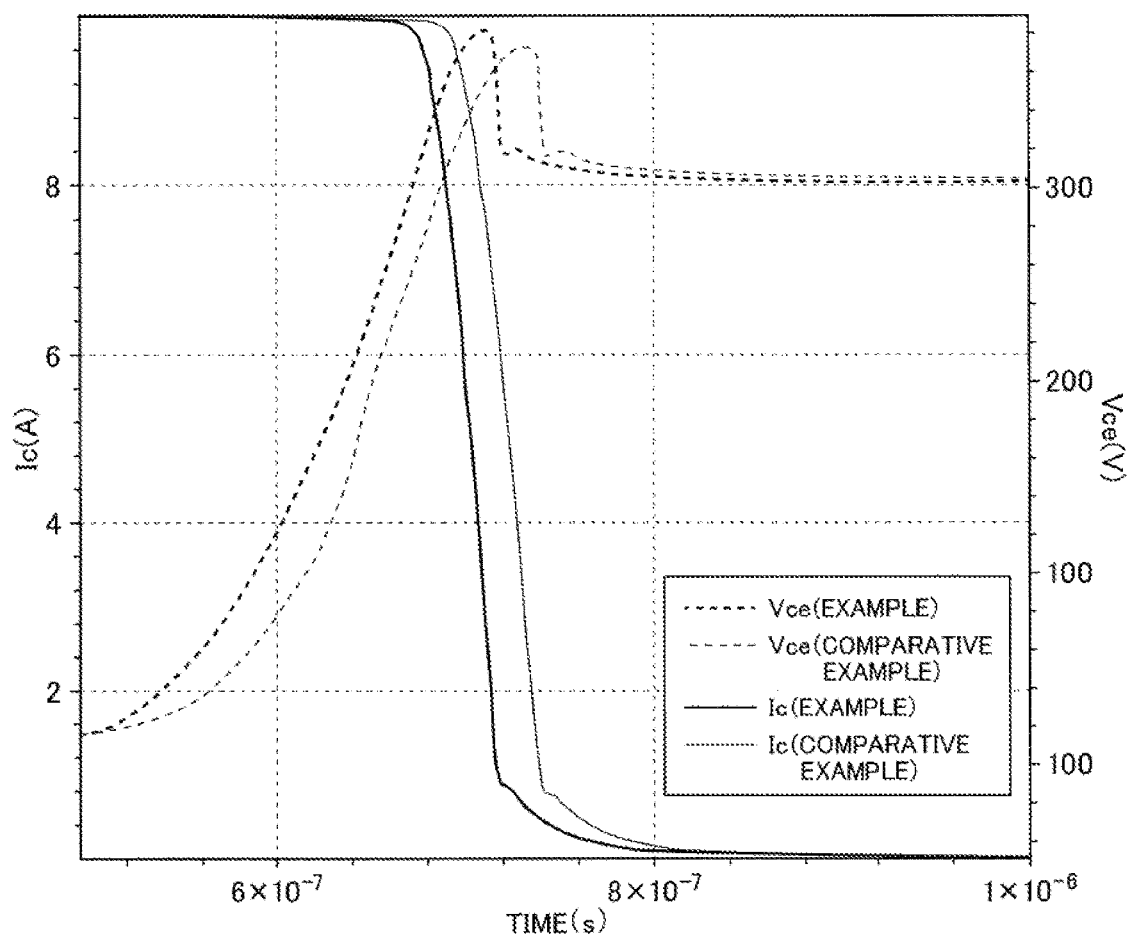
FIG. 6 is a graph comparing switching waveforms of Example according to the first modification of the first embodiment of the present invention with Comparative Example.
Figure 7:
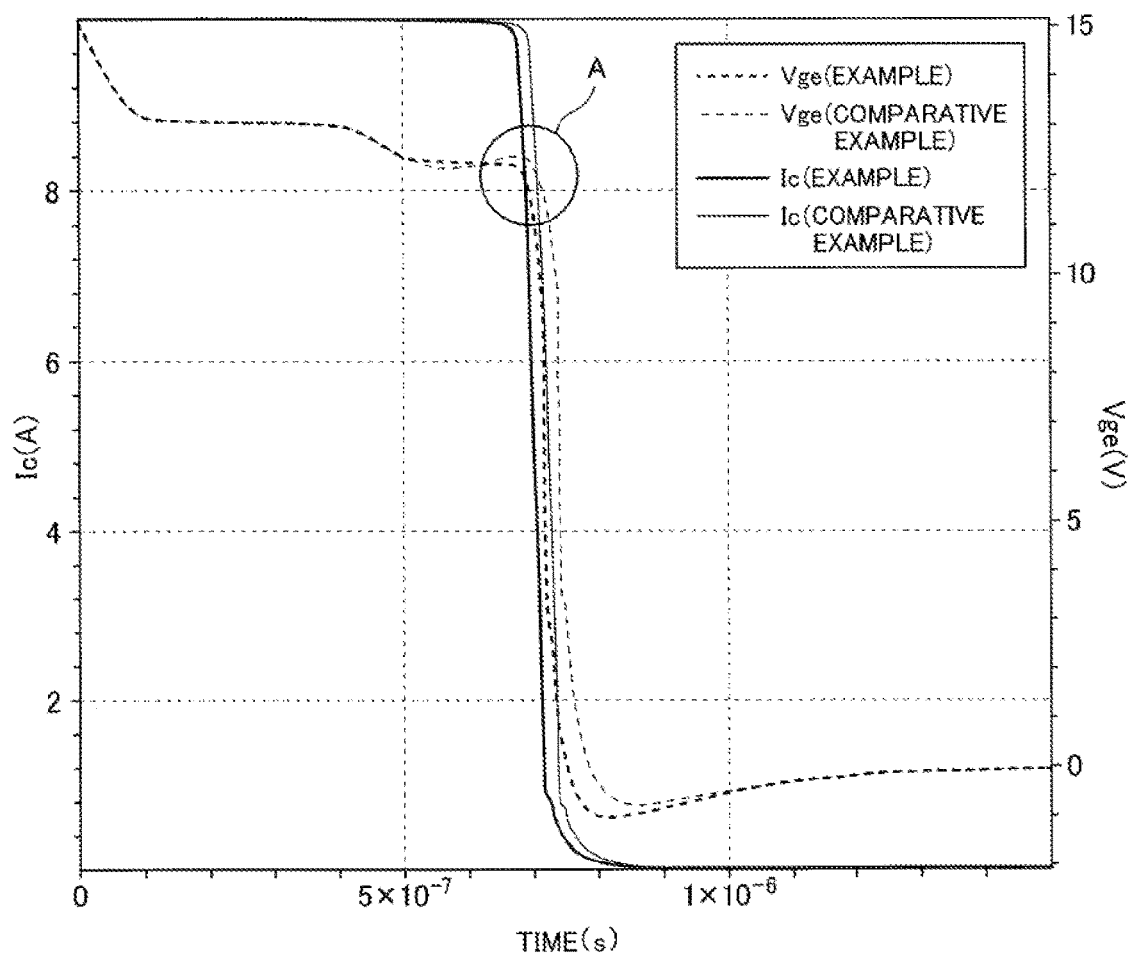
FIG. 7 is a graph comparing gate waveforms of FIG. 6 of Example according to the first modification of the first embodiment of the present invention with Comparative Example.

FIG. 6 illustrates turn-off waveforms obtained by device simulation for Example including the structure illustrated in FIG. 5 and Comparative Example. Comparative Example (not illustrated) has the same structure as illustrated in FIG. 5 except that Comparative Example does not include the gate screening semiconductor layer 12. In FIG. 7, thick dashed line plots collector-emitter voltage $V_{ce}$ of Example, and thin dashed line plots collector-emitter voltage $V_{ce}$ of Comparative Example. Thick solid line plots collector current $I_c$ of Example, and thin solid line plots collector current $I_c$ of Comparative Example. FIG. 6 reveals that the rise time of Example is shorter than that of Comparative Example.

FIG. 7 compares gate voltage waveform in FIG. 6, which are obtained by device simulation for Example having the structure illustrated in FIG. 5 and Comparative Example. In FIG. 7, thick dashed line plots gate-emitter voltage $V_{ge}$ of Example, and thin dashed line plots gate-emitter voltage $V_{ge}$ of Comparative Example. Thick solid line plots collector current $I_c$ of Example, and thin solid line plots collector current $I_c$ of Comparative Example. In Comparative Example, the gate voltage $V_{ge}$ rises (increases) just before turn off due to remaining holes, as illustrated by the thin dashed line within circle A of FIG. 7. In Example, the gate voltage $V_{ge}$ drops without rising as illustrated by the thick dashed line. The turn off current $I_c$ therefore decreases more quickly than that of Comparative Example, and the collector-emitter voltage $V_{ce}$ increases more quickly. The switching speed is thus increased.

According to device simulation, the turn-off power loss of Example is 35.1 mJ, which is lower than the turn-off power loss of 35.4 mJ of the comparative example. Moreover, according to device simulation, the breakdown voltage of Example is 711 V, which is higher than the breakdown voltage of 669 V of Comparative Example. The on-state-voltage by device simulation for Example is 1.776 V, which is approximately equal to the on-state-voltage of 1.774 of Comparative Example.

<Second Modification>

Figure 8:
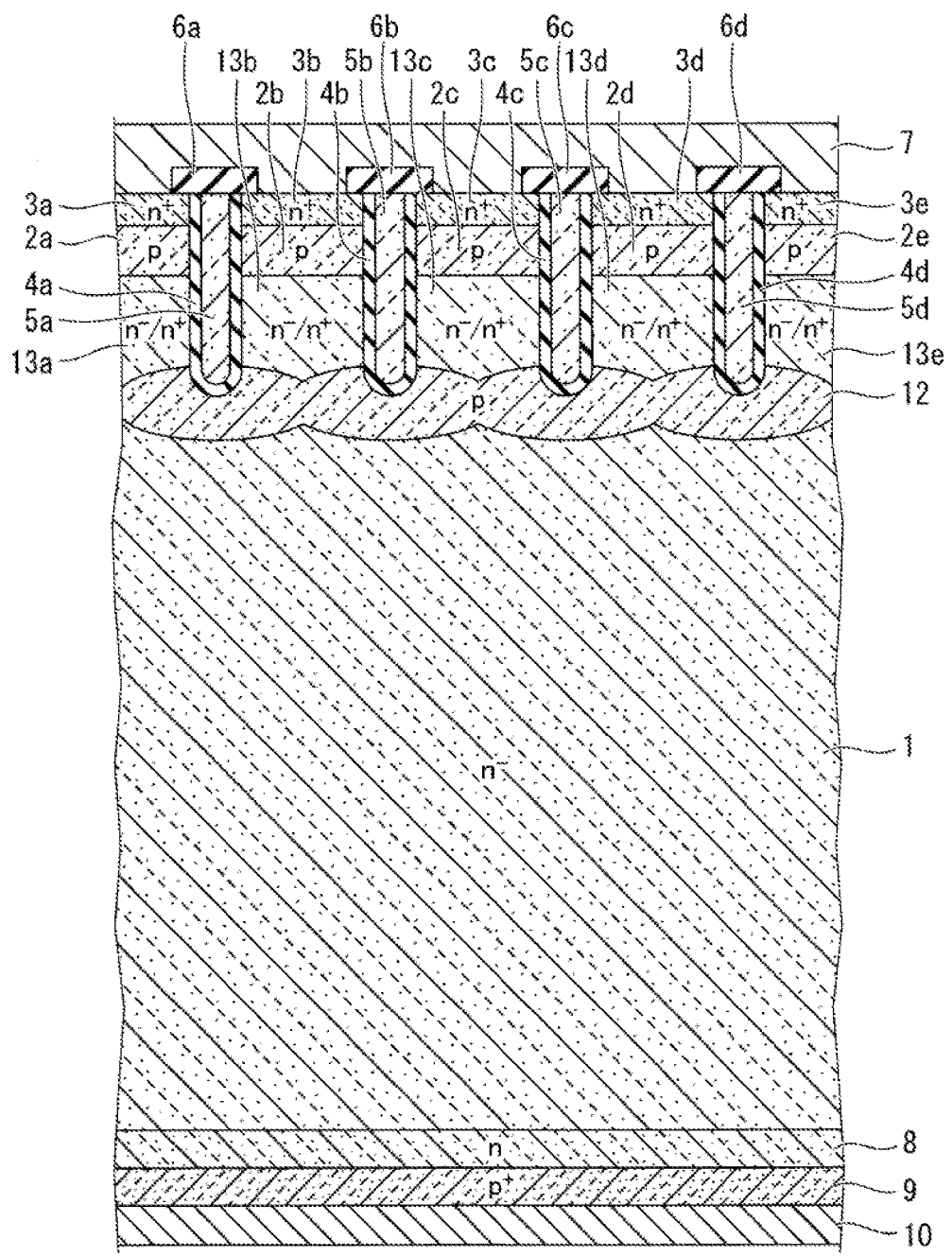
FIG. 8 is a cross-sectional view illustrating an example of the configuration of a semiconductor device according to a second modification of the first embodiment of the present invention.

FIG. 8 illustrates the configuration of a semiconductor device according to a second modification of the first embodiment of the present invention. In the semiconductor device according to the second modification of the first embodiment of the present invention, gate electrodes 5a to 5d are buried in a plurality of trenches through gate insulating films 4a to 4d. A p-type gate screening semiconductor layer 12 is uniformly buried along the main surface (top surface) of the drift layer 1 so as to cover the bottoms of the plurality of trenches. $N^-$-type or $n^+$-type intermediate semiconductor layers 13a to 13e are buried between the gate screening semiconductor layer 12 and the base regions 2a to 2e. Emitter regions 3a to 3e are established on the base regions 2a to 2e.

The second modification of the first embodiment of the present invention has a configuration which is different from that of the first embodiment of the present invention illustrated in FIG. 1 in that the gate screening semiconductor layer 12 has uneven thickness. The gate screening semiconductor layer 12 relatively thick around the bottom of each gate electrode 5a to 5d and becomes thinner toward the center of adjacent trenches.

With the semiconductor device according to the second modification of the first embodiment of the present invention, the gate screening semiconductor layer 12 is uniformly buried to sheathe the bottoms of the plurality of trenches in a similar manner to the first embodiment of the present invention. Therefore, the turn-off power loss can be decreased, while the on-state-voltage is prevented from increasing, improving the breakdown voltage. Moreover, the gate screening semiconductor layer 12 sheathes the bottoms of the plurality of trenches so as to relax the electric field at the bottoms of the plurality of trenches, the rise in gate voltage can be decreased at switching, and the switching speed can be increased.

Next, an example of the method of manufacturing a semiconductor device according to the second modification of the first embodiment of the present invention will be explained. The method of manufacturing a semiconductor device described below is just an example. It is obvious that the present invention can be produced by other various manufacturing methods including the modifications without departing from the scope of the claims.

Figure 9A:
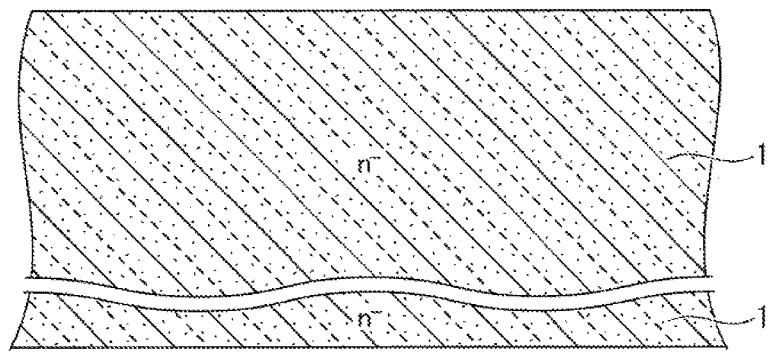
FIGS. 9A to 9C are cross-sectional process views for explaining an example of a method of manufacturing a semiconductor device according to a second modification of the first embodiment of the present invention.
Figure 9B:
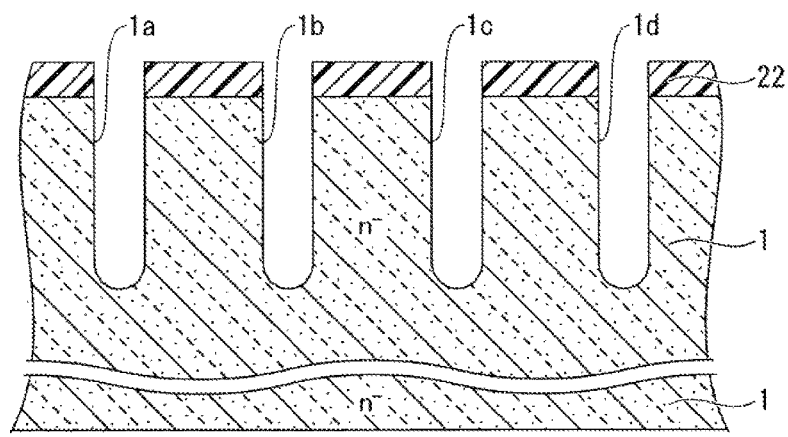

(a) As illustrated in FIG. 9A, an n⁻-type semiconductor substrate 1 is prepared, which is made by a single crystal Si or the like. On the semiconductor substrate 1, a photoresist film 22 is coated. The photoresist film 22 is then delineated using photolithography. Using the delineated photoresist film 22 as a mask, recesses (trenches) 1a to 1d are selectively formed by dry etching, such as RIE, as illustrated in FIG. 9B. The photoresist film 22 is then removed by O₂ plasma or the like. The trenches 1a to 1d may be formed by forming oxide film on the semiconductor substrate 1, delineating the oxide film using photoresist film coated to the oxide film as an etching mask, and then performing dry etching or the like using the oxide film as an etching mask.

Figure 9C:
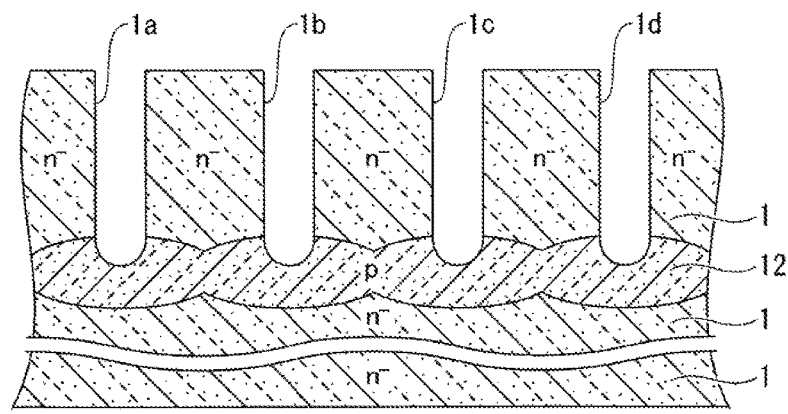

(b) Next, p-type impurity ions, such as B⁺, are implanted into the bottoms of the trenches 1a to 1d. Subsequently, heat treatment is performed to activate the ions implanted into the bottoms of the trenches 1a to 1d and thermally diffuse the activated p-type impurity element in the horizontal direction. The p-type impurity regions at the bottoms of the trenches 1a to 1d are thereby connected to each other to form the gate screening semiconductor layer 12 throughout in the direction parallel to the surface of the semiconductor substrate 1. As illustrated in FIG. 9C, the p-type gate screening semiconductor layer 12 is thus formed by a trench self-alignment process so as to sheathe the bottoms of the trenches 1a to 1d. The p-type impurity element may be additionally thermally diffused by a later-described thermal oxidation at depositing the gate insulating film 4 as a part of the aforementioned heat treatment. Alternatively, heat diffusion may be designed so that the p-type impurity regions at the bottoms of the trenches 1a to 1d are eventually connected to each other to form the gate screening semiconductor layer 12 in the heat treatment process for forming n⁺-type or n⁻-type intermediate semiconductor layers 13a to 13e (described later).

Figure 10A:
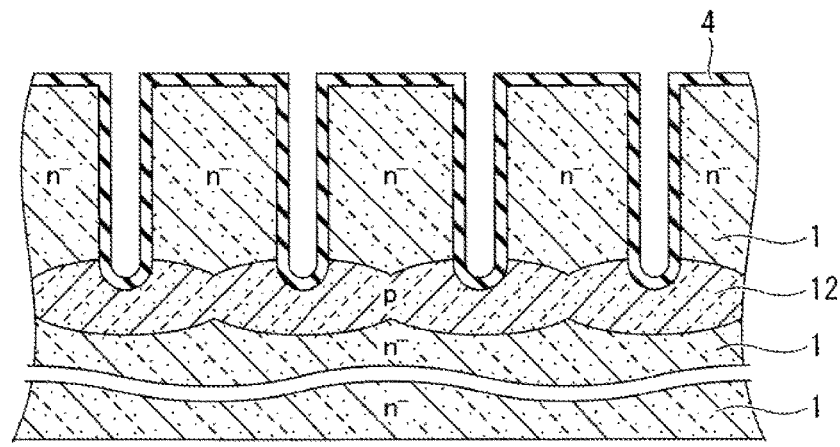
FIGS. 10A to 10C are cross-sectional process views subsequent to FIGS. 9A to 9C for explaining the example of the method of manufacturing a semiconductor device according to the second modification of the first embodiment of the present invention.
Figure 10B:
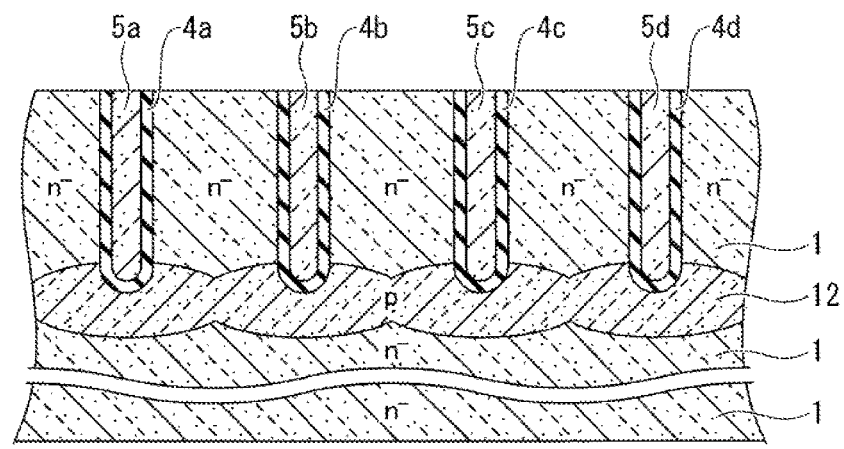

(c) Next, a gate insulating film 4 made by SiO₂ film is formed on the semiconductor substrate 1 and the inner surfaces of the trenches 1a to 1d by thermal oxidation or the like as illustrated in FIG. 10A. On the gate insulating film 4, a polysilicon layer doped with n-type impurity ions is deposited by CVD or the like. The doped polysilicon layer is etched back or additionally subjected to a planarization process, such as chemical mechanical polishing (CMP), so that the doped polysilicon layer 5 is buried in the trenches 1a to 1d through the gate insulating film 4, followed by delineating for the gate electrodes 5a to 5d. The gate insulating film 4 is selectively removed as illustrated in FIG. 10B by dry etching or the like using the etching selection ratio of the gate insulating film 4 and the doped polysilicon layer 5. This exposes the top surface of the semiconductor substrate 1 as illustrated in FIG. 10B.

(d) Next, to form the n⁺-type or n⁻-type intermediate semiconductor layers 13a to 13e at a comparatively deep position in upper part of the semiconductor substrate 1, n-type impurity ions, such as As⁺ or P⁺ ions, are implanted. Subsequent heat treatment activates the implanted n-type impurity ions to thermally diffuse the activated n-type impurity element at the comparatively deep position in upper part of the semiconductor substrate 1. To form the base regions 2a to 2e at a shallower position than the intermediate semiconductor layers 13a to 13e in upper part of the semiconductor substrate 1, p-type impurity ions are implanted with a projected range shallower than the intermediate semiconductor layers 13a to 13e. Subsequent heat treatment activates the implanted p-type impurity ions to thermally diffuse the activated p-type impurity element.

Figure 10C:
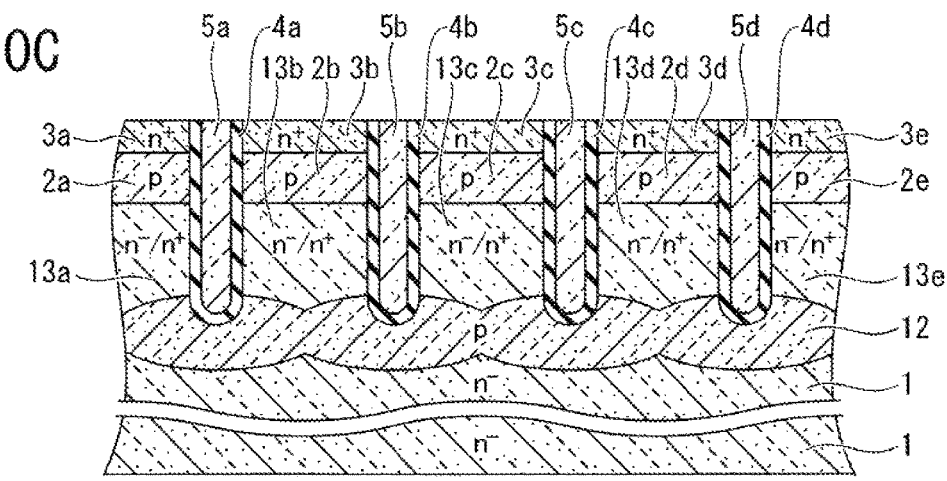

(e) To form the emitter regions 3a to 3e at a shallow position in the top surface side of the semiconductor substrate 1, n-type impurity ions are implanted with a projected range shallower than the base regions 2a to 2e. Subsequent heat treatment activates the implanted impurity ions to form the n⁺-type or n⁻-type intermediate semiconductor layers 13a to 13e, the p-type base regions 2a to 2e, and the n⁺-type emitter regions 3a to 3e as illustrated in FIG. 10C. The subsequent process is the same as that of the method of manufacturing a semiconductor device according to the first embodiment illustrated in FIGS. 4B and 4C, and the overlapping description thereof is omitted.

With the method of manufacturing a semiconductor device according to the second modification of the first embodiment of the present invention, the gate screening semiconductor layer 12 at the bottoms of the trenches 1a to 1d is formed by ion implantation and heat treatment, so that the semiconductor device illustrated in FIG. 8 can be implemented at low cost and less process variations. Moreover, it is obvious that the semiconductor device illustrated in FIG. 8 can be implemented by performing the aforementioned processes in the following order. First, the multilayer structure in upper part of the semiconductor substrate 1, including the gate screening semiconductor layer 12, is epitaxially grown successively, and then the trenches 1a to 1d are etched.

<Third Modification>

Figure 11:
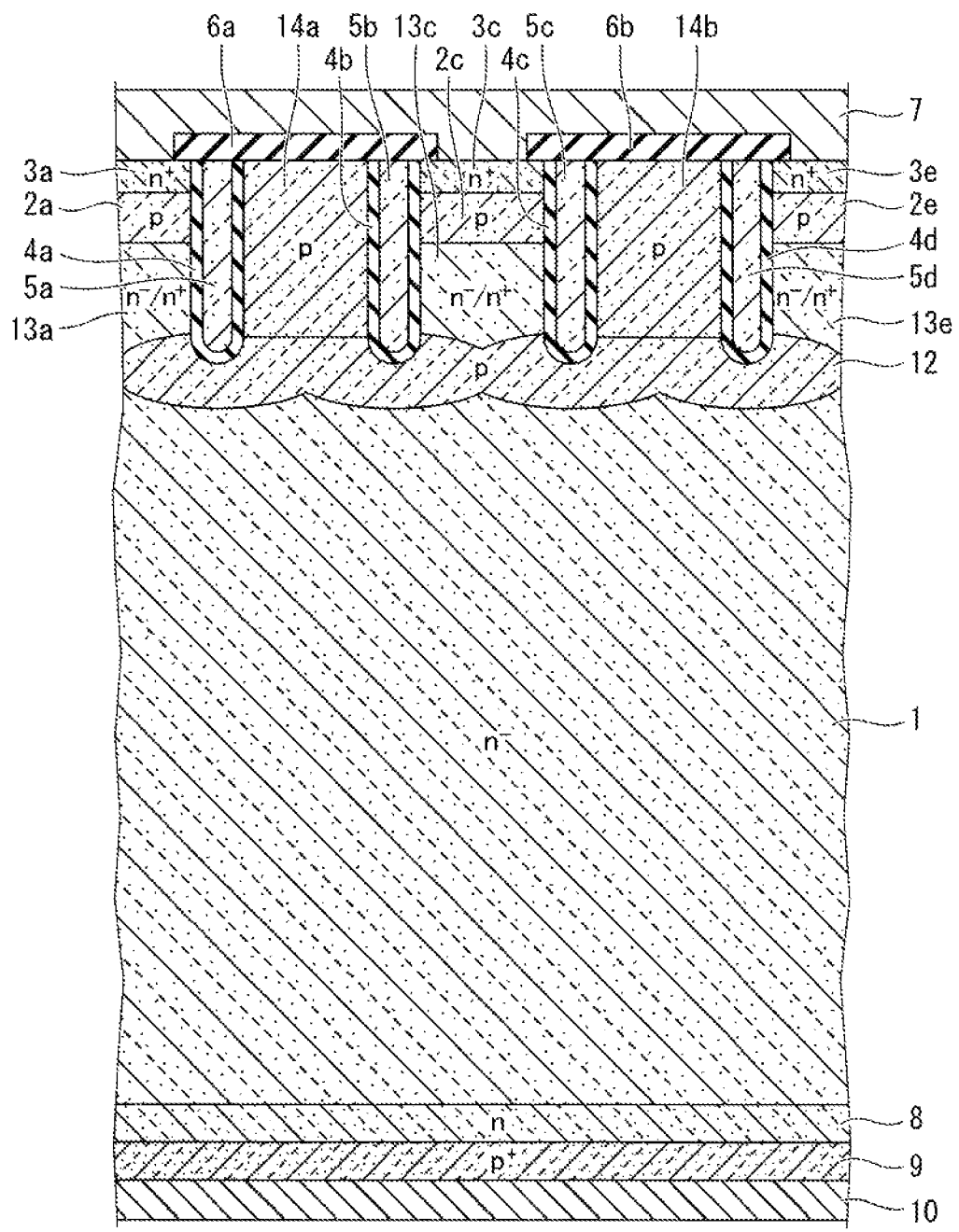
FIG. 11 is a cross-sectional view illustrating an example of the configuration of a semiconductor device according to a third modification of the first embodiment of the present invention.

FIG. 11 illustrates the configuration of a semiconductor device according to a third modification of the first embodiment of the present invention. The configuration of the semiconductor device according to the third modification of the first embodiment of the present invention is different from that of the second modification of the first embodiment of the present invention illustrated in FIG. 8 in that some of mesa regions between adjacent trenches constitute p-type mesa regions 14a and 14b. The p-type mesa regions 14a and 14b are electrically connected to the gate screening semiconductor layer 12. Therefore, it is possible to prevent holes from influencing the potential of the gate electrodes 5a and 5b in a similar manner to the first modification of the first embodiment of the present invention illustrated in FIG. 5.

The gate screening semiconductor layer 12 is formed in a similar manner to the method of manufacturing a semiconductor device according to the second modification of the first embodiment of the present invention. First, the plurality of trenches 1a to 1d as illustrated in FIG. 9B are formed, and p-type impurity ions are implanted to the bottoms of the trenches 1a to 1d as illustrated in FIG. 9C, followed by thermal diffusion. The p-type mesa regions 14a and 14b can be formed by selectively implanting p-type impurity ions using a mask, followed by heat treatment, instead of forming the n⁺-type or n⁻-type intermediate semiconductor layers 13b and 13d, the p-type base regions 2b and 2d, and the n⁺-type emitter regions 3b and 3d as illustrated in FIG. 10C.

<Fourth Modification>

Figure 12:
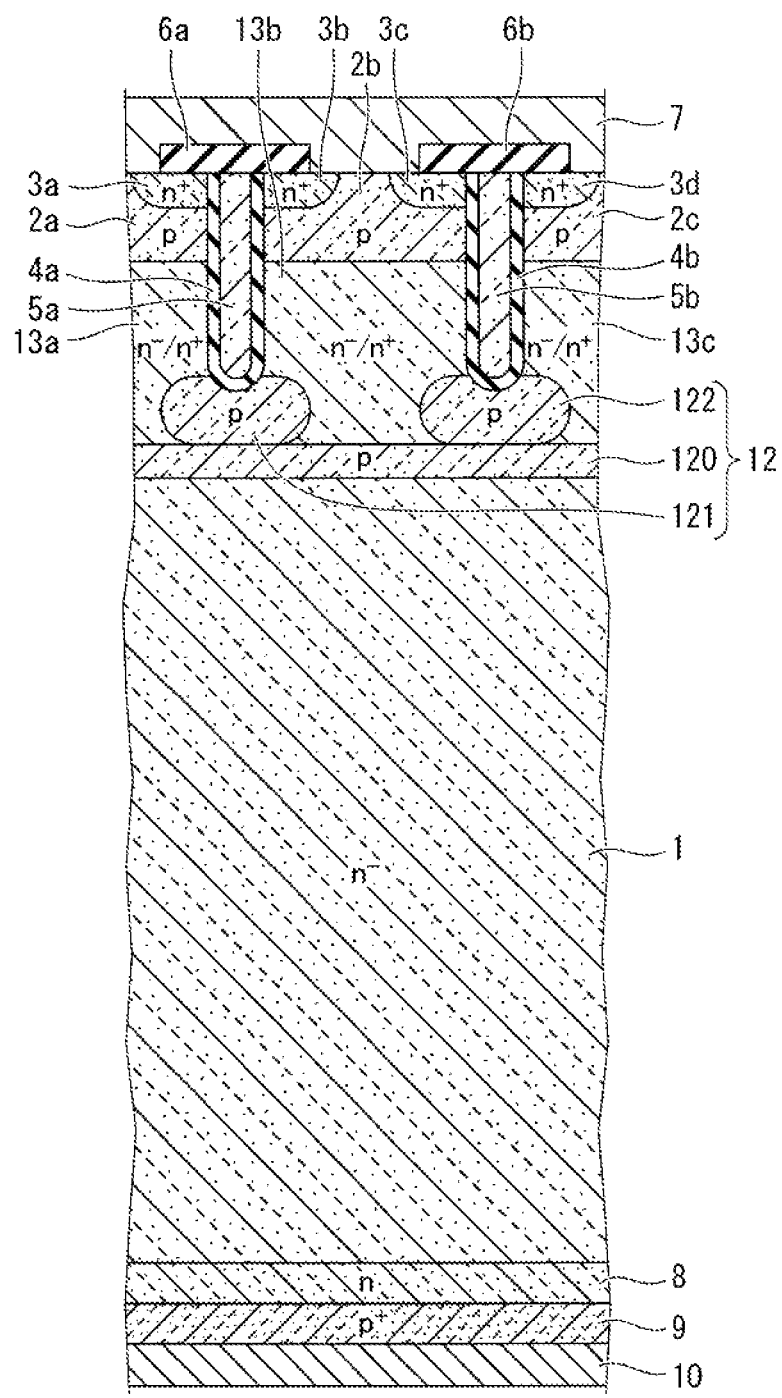
FIG. 12 is a cross-sectional view illustrating an example of the configuration of a semiconductor device according to a fourth modification of the first embodiment of the present invention.

FIG. 12 illustrates the configuration of a semiconductor device according to a fourth modification of the first embodiment of the present invention. The configuration of the semiconductor device according to the fourth modification of the first embodiment of the present invention is different from that of the first embodiment of the present invention illustrated in FIG. 1 in that the gate screening semiconductor layer 12 includes a p-type flat layer 120 and p-type bridge layers 121 and 122. The p-type flat layer 120 is separated from the plurality of trenches in the depth direction. The p-type bridge layers 121 and 122 are buried to connect the flat layer 120 to the respective bottoms of the plurality of trenches.

The flat layer 120 is uniformly buried along the main surface of the drift layer 1. The bridge layers 121 and 122 are in contact with the gate insulating films 4a and 4b so as to sheathe the bottom surfaces of the plurality of trenches, respectively. The bridge layers 121 and 122 are in contact with the flat layer 120 and are separated from the base regions 2a to 2c. The bridge layers 121 and 122 adjacent to each other are separated from each other.

According to the fourth modification of the first embodiment of the present invention, inclusion of the flat layer 120 can decrease the turn-off power loss, while preventing the increase of the on-state-voltage, and also improve the breakdown voltage. Moreover, inclusion of the bridge layers 121 and 122, which sheathe the bottoms of the plurality of trenches, can relax the electric field at the bottoms of the gate electrodes 5a and 5b. This can suppress a rise in gate voltage at switching, increasing the switching speed.

The semiconductor device according to the fourth modification of the first embodiment of the present invention is formed so that the plurality of trenches do not reach the flat layer 120. The bridge layers 121 and 122 are formed in contact with the flat layer 120 by performing ion implantation for the bottom surfaces of the plurality of trenches and heat treatment.

<Fifth Modification>

Figure 13:
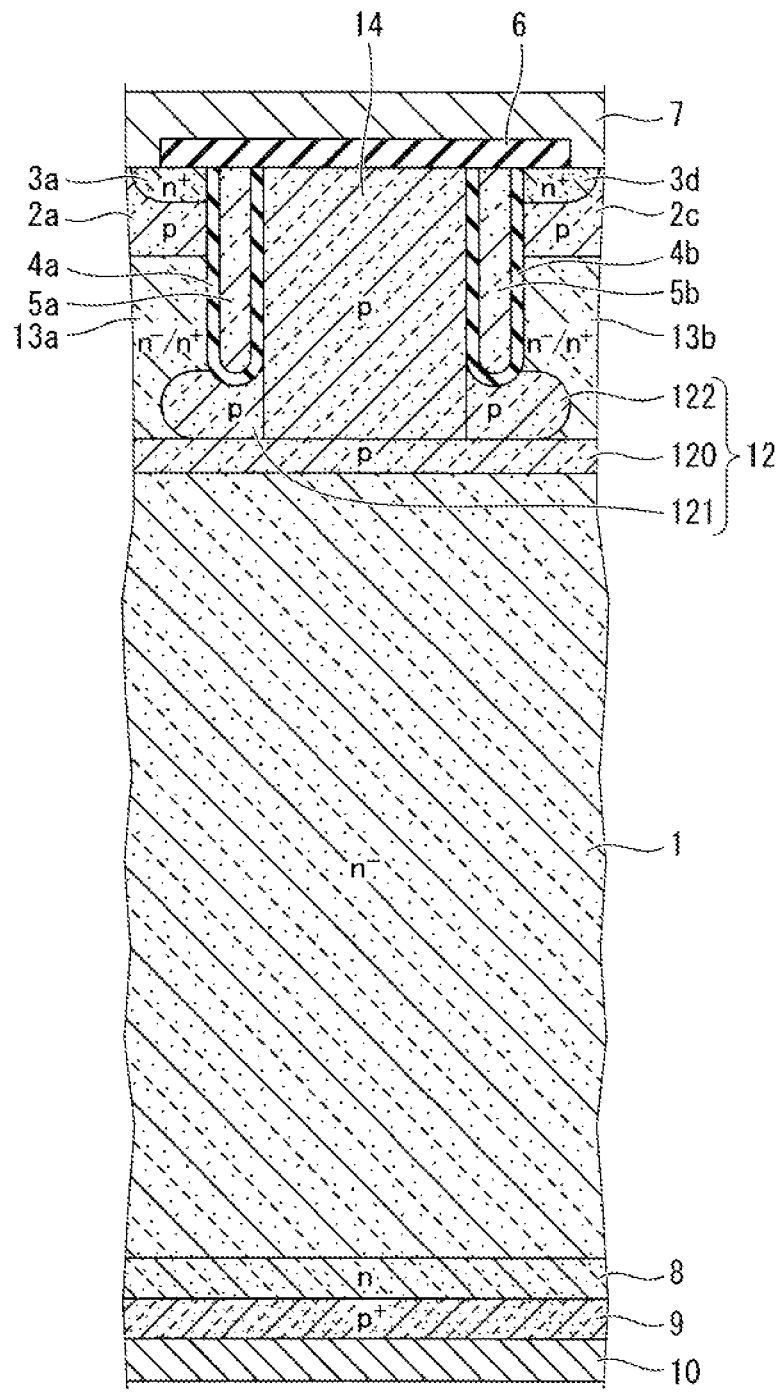
FIG. 13 is a cross-sectional view illustrating an example of the configuration of a semiconductor device according to a fifth modification of the first embodiment of the present invention.

FIG. 13 illustrates the configuration of the semiconductor device according to a fifth modification of the first embodiment of the present invention. The configuration of the semiconductor device according to the fifth modification of the first embodiment of the present invention is different from that of the fourth modification of the first embodiment of the present invention illustrated in FIG. 12 in that a p-type mesa region 14 with the surface covered with insulating film is buried in a part of the mesa region between adjacent trenches.

The top surface of the p-type mesa region 14 is covered with the interlayer insulating film 6. The p-type mesa region 14 is in contact with the gate screening semiconductor layer 12. The p-type mesa region 14 electrically connects the p-type bridge layers 121 and 122 adjacent to each other. Inclusion of the p-type mesa region 14 can prevent holes from influencing the potential of the gate electrodes 5a and 5b. The p-type mesa region 14 can be formed by selectively implanting p-type impurity ions, such as B ions, using a mask into the surface of the intermediate semiconductor layer 13 illustrated in FIG. 2B, followed by heat treatment, for example.

According to the fifth modification of the first embodiment of the present invention, inclusion of the flat layer 120 can decrease the turn-off power loss, while preventing the increase of the on-state-voltage, and also improve the breakdown voltage. Moreover, inclusion of the bridge layers 121 and 122, which sheathe the bottoms of the plurality of trenches, can relax the electric field at the bottoms of the gate electrodes 5a and 5b. Therefore, a rise in gate voltage can be decreased at switching, increasing the switching speed.

Second Embodiment

<Structure of Semiconductor Device>

Figure 14:
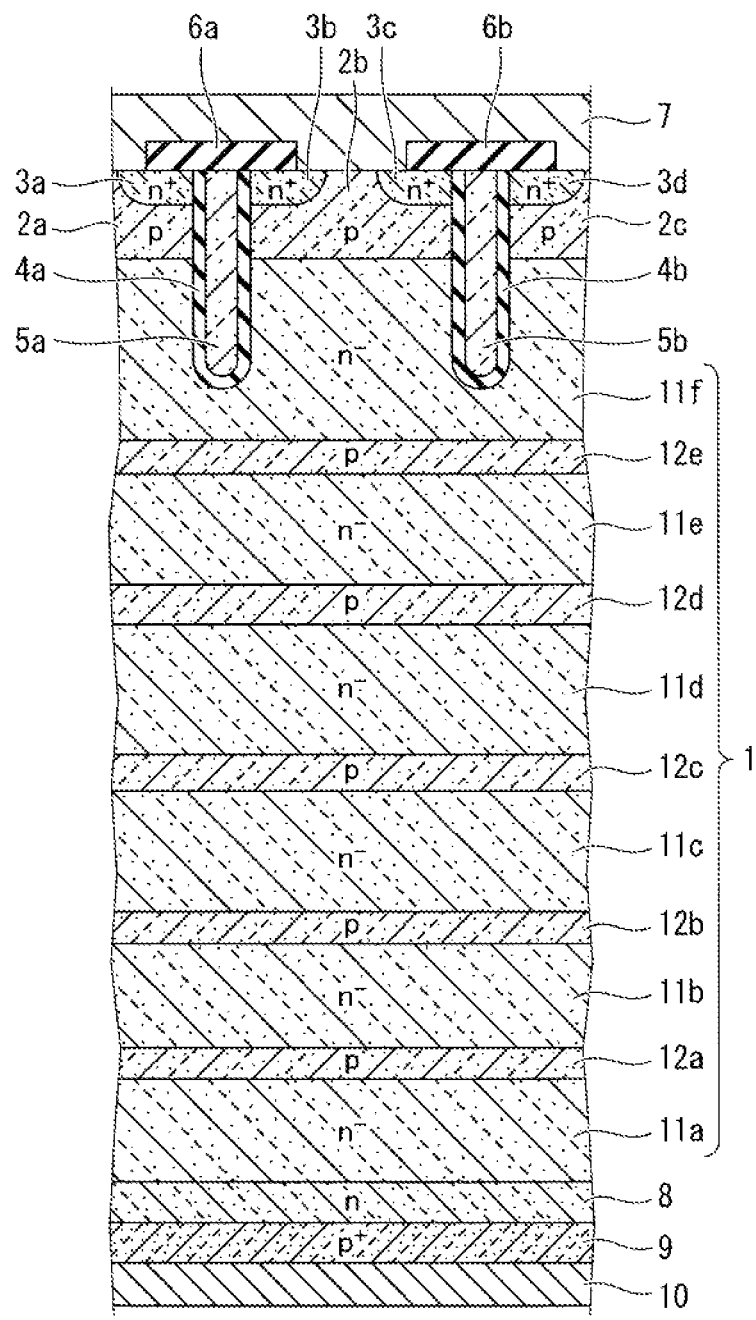
FIG. 14 is a cross sectional view illustrating an example of the configuration of a main part of an element area (an active area) of a semiconductor device according to a second embodiment of the present invention.

An IGBT having a trench gate structure as a semiconductor device according to a second embodiment of the present invention will be explained. As illustrated in FIG. 14, the configuration of the element area (the active area) of the semiconductor device according to the second embodiment of the present invention is different from that of the first embodiment of the present invention illustrated in FIG. 1 in terms of not including the gate screening semiconductor layer 12 illustrated in FIG. 1. Moreover, the structure of the drift layer 1 is different from that of the configuration according to the first embodiment of the present invention illustrated in FIG. 1.

The drift layer 1 is implemented by a stacked structure including a plurality of main semiconductor layers 11a to 11f of a first conductivity type ($n^-$-type) and auxiliary semiconductor layers 12a to 12e of a second conductivity type ($p^-$-type). The main semiconductor layers 11a to 11f include at least the main semiconductor layers 11a and 11f, which are located in the upper and bottom surfaces of the drift layer 1. The auxiliary semiconductor layers 12a to 12e are alternately sandwiched between the main semiconductor layers 11a to 11f. On the top surface side of the drift layer 1, first main electrode regions (emitter regions) 3a to 3d of the first conductivity type ($n^+$-type) are established. The emitter regions 3a to 3d have an impurity concentration higher than that of the main semiconductor layers 11a to 11f.

The semiconductor device according to the second embodiment of the present invention further includes a carrier control structure configured to control the movement of carriers being transported in the drift layer 1. The carrier control structure includes base regions 2a to 2c of the second conductivity type (p-type), gate electrodes 5a and 5b, and gate insulating films 4a and 4b. The base regions 2a to 2c are provided at least between the emitter regions 3a to 3d and the drift layer 1. The gate insulating films 4a and 4b are provided within trenches which penetrate the base regions 2a to 2c and reach upper part of the drift layer 1. The trenches have a width of about 1 μm and a depth of about 3 μm, for example. The distance between centers of adjacent trenches is about 2.5 μm, for example. The gate electrodes 5a and 5b are buried in the respective trenches through the gate insulating films 4a and 4b. The gate electrodes 5a and 5b electrostatically control the potential within the base regions 2a to 2c for controlling movement of carriers being injected into the drift layer 1 through the base regions 2a to 2c.

An emitter electrode 7 is laminated on the gate electrodes 5a and 5b through interlayer insulating films 6a and 6b. The emitter electrode 7 is separated from gate wiring (not illustrated) located at a rearward portion of the paper. The emitter electrode 7 is in contact with the emitter regions 3a to 3d and the base regions 2a to 2c. The emitter electrode 7 and the gate wiring can be made by aluminum (Al) or aluminum alloy such as Al-silicon (Si), Al-copper (Cu), or Al—Cu—Si, for example.

A second main electrode region (a collector region) 9 of the second conductivity type ($p^+$-type) is established on the bottom surface side of the drift layer 1. An n-type field stop (FS) layer 8 is established between the drift layer 1 and the collector region 9. The n-type FS layer 8 has a higher impurity concentration than that of the main semiconductor layers 11a to 11f of the drift layer 1. A collector electrode 10 is laminated on the bottom surface of the collector region 9. The collector electrode 10 can be implemented by a single-layer film made by gold (Au) or a stacked metallic film made by Al, nickel (Ni), and Au in this order, for example. The collector electrode 10 may further include a metallic plate made by molybdenum (Mo), tungsten (W), or the like provided in the bottom layer.

In the drift layer 1, the plurality of (six) $n^-$-type main semiconductor layers 11a to 11f and the plurality of (five)

p-type auxiliary semiconductor layers 12a to 12e are alternately arranged. The numbers of p-type auxiliary semiconductor layers 12a to 12e and n⁻-type main semiconductor layers 11a to 11f alternately arranged are not particularly limited. The drift layer 1 needs to include at least one auxiliary semiconductor layer and at least two main semiconductor layers sandwiching the at least one auxiliary semiconductor layer.

The thickness from the surfaces of the emitter regions 3a to 3d to the bottom surface of the collector region 9 is about 60 μm, for example. The auxiliary semiconductor layers 12a to 12e are buried at regular 10 μm intervals beginning from a 10 μm depth from the surface of the emitter regions 3a to 3d in the depth direction. The intervals of the auxiliary semiconductor layers 12a to 12e may vary in the depth direction. For example, the distance between each pair of the auxiliary semiconductor layers 12a to 12e adjacent to each other increases with the depth from the surfaces of the emitter regions 3a to 3d.

The auxiliary semiconductor layers 12a to 12e have a thickness of about 2 μm, and the main semiconductor layers 11a to 11f have a thickness of about 8 μm. The thicknesses of the auxiliary semiconductor layers 12a to 12e may be the same or different from each other. The thicknesses of the main semiconductor layers 11a to 11f may be also the same or different from each other. In FIG. 14, the auxiliary semiconductor layers 12a to 12e are thinner than the main semiconductor layers 11a to 11f. The auxiliary semiconductor layers 12a to 12e may have the same thickness as or may be thicker than the main semiconductor layers 11a to 11f.

Each of the main semiconductor layers 11a to 11f has an impurity concentration of about $0.7 \times 10^{13}$ cm⁻³. The impurity concentrations of the main semiconductor layers 11a to 11f may be the same or different from each other. The auxiliary semiconductor layers 12a to 12e have an impurity concentration of about $2 \times 10^{14}$ cm⁻³. The impurity concentrations of the main semiconductor layers 12a to 12e may be the same or different from each other.

Figure 15:
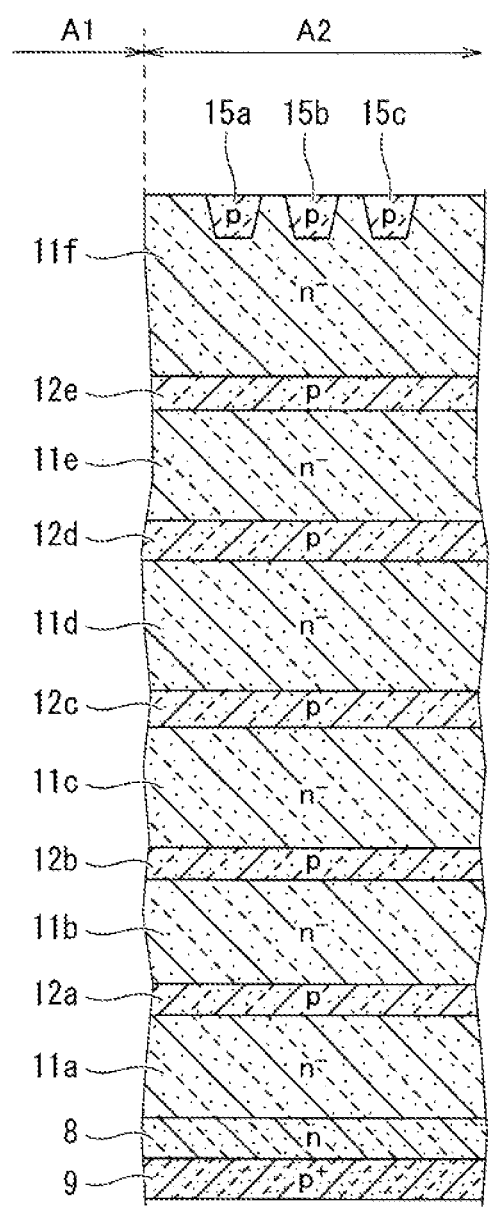
FIG. 15 is a cross-sectional view illustrating an example of an edge termination area in the periphery of the element area in the semiconductor device according to the second embodiment of the present invention.

FIG. 15 illustrates an example of an edge termination area A2 in the periphery of the element area A1 of the semiconductor device according to the second embodiment of the present invention. In upper part of the main semiconductor layer 11f, guard rings 15a to 15c for improving the breakdown voltage are established. The end of the semiconductor device has a face including many discontinuous planes due to dicing. The ends of the auxiliary semiconductor layers 12a to 12e are exposed in the discontinuous end face. The gate screening semiconductor layer 12 of the semiconductor device according to the first embodiment of the present invention illustrated in FIG. 1 may be exposed in the discontinuous end face in the edge termination area A2 in a similar manner to the auxiliary semiconductor layers 12a to 12e illustrated in FIG. 15.

Figure 16:
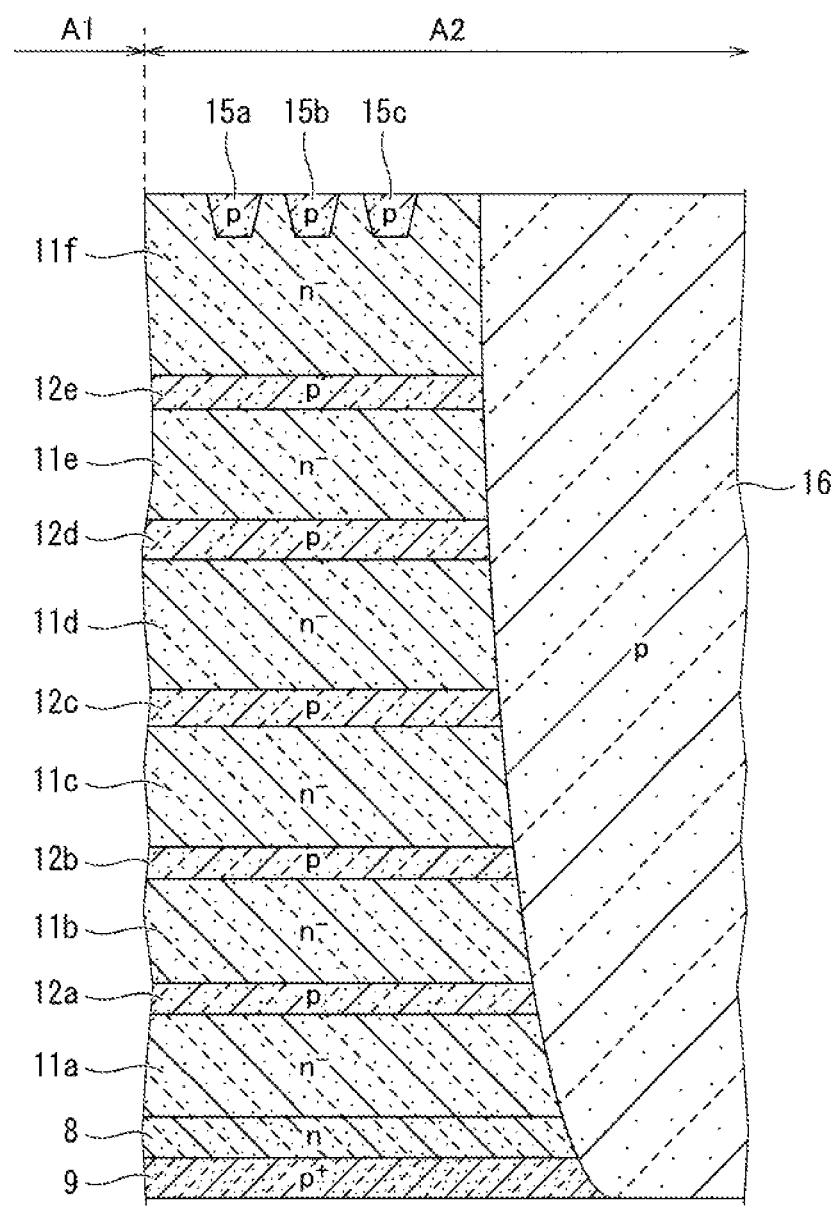
FIG. 16 is a cross-sectional view illustrating another example of the edge termination area in the periphery of the element area in the semiconductor device according to the second embodiment of the present invention.

FIG. 16 illustrates another example of the edge termination area A2 in the periphery of the element area A1 of the semiconductor device according to the second embodiment of the present invention. The another example is the same as the example illustrated in FIG. 15 in that the guard rings 15a to 15c to improve the breakdown voltage are established in upper part of the main semiconductor layer 11f. The configuration illustrated in FIG. 16 is different from that illustrated in FIG. 15 in that a p-type semiconductor region 16 is established at the end of the semiconductor device from the first main surface (top surface) to the second main surface (bottom surface) to terminate the ends of the auxiliary semiconductor layers 12a to 12b. In a similar manner to the auxiliary semiconductor layer 12a illustrated in FIG. 16, the end of the gate screening semiconductor layer 12 of the semiconductor device according to the first embodiment of the present invention illustrated in FIG. 1 may be terminated by the p-type semiconductor region 16 in the edge termination area A2.

As illustrated in FIGS. 15 and 16, the auxiliary semiconductor layers 12a to 12e may be horizontally extended from the element area A1 illustrated in FIG. 14 to the edge termination area A2 in the periphery of the element area A1 in a plane pattern. The auxiliary semiconductor layers 12a to 12e may have a higher impurity concentration in the edge termination area A2 than in the element area A1. Moreover, the auxiliary semiconductor layers 12a to 12e may be thicker in the edge termination area A2 than in the element area A1.

Next, an example of the operation of the semiconductor device (IGBT) according to the second embodiment will be explained. At turn on of the semiconductor device according to the second embodiment, positive voltage is applied to the gate electrodes 5a and 5b while the emitter electrode 7 illustrated in FIG. 14 is grounded and positive voltage is applied to the collector electrode 10. Channel layers (inversion-layers) are then formed in the base regions 2a to 2c, bringing the semiconductor device into the on-state. Carriers are then injected into the main semiconductor layer 11f through the channel layers.

Figure 18:
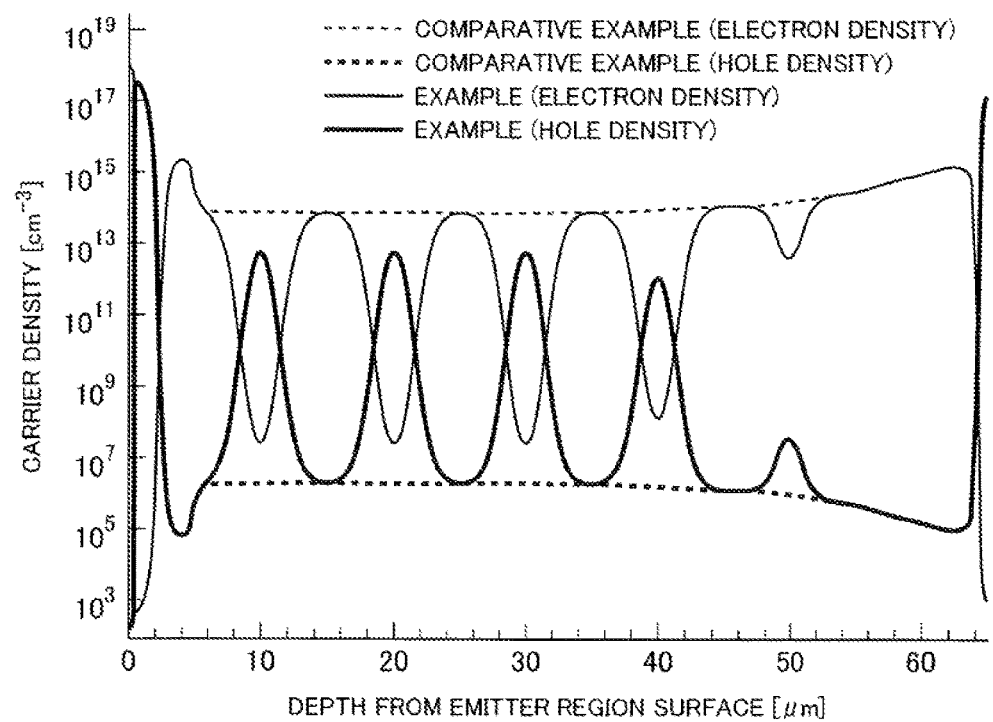
FIG. 18 is a graph comparing the carrier density distribution (one-dimensional profile) of Example according to the second embodiment of the present invention with Comparative Example.

On the other hand, at turnoff of the semiconductor device according to the second embodiment of the present invention, when the voltage applied to the gate electrodes 5a and 5b is decreased to less than the threshold value, the channel layers in the base regions 2a to 2c disappear, bringing the semiconductor device into the off-state. The depletion layer then expands. When the depletion layer expands from the base regions 2a to 2c and reaches the p-type auxiliary semiconductor layer 12e of the drift layer 1, the drift layer 1 is depleted faster than the earlier structure in which the drift layer is implemented by only an n⁻-type semiconductor layer. Moreover, the density of holes is high as illustrated in FIG. 18, and excess electrons therefore disappear more quickly. The turn-off speed is therefore increased, and the power loss can be decreased. Moreover, the drift layer 1 includes such a potential distribution that the integral of the electric field is larger than that of the earlier structure in which the drift layer is implemented by only an n⁻-type semiconductor layer. This can improve the breakdown voltage. Accordingly, the semiconductor device according to the second embodiment can be made thinner than that of an earlier single-layer structure in which the drift layer is implemented by only a uniform n⁻-type semiconductor layer if the semiconductor devices are configured to have the same breakdown voltage. The semiconductor device according to the second embodiment can therefore operate with higher speed and lower power loss.

Examples

Next, results of device simulation for Example of the semiconductor device according to the second embodiment of the present invention will be explained, compared with Comparative Example. Example has a structure described with the semiconductor device according to the second embodiment of the present invention illustrated in FIG. 14. The drift layer 1 has a multilayer stacked structure in which the p-type auxiliary semiconductor layers 12a to 12e are established with a thickness of 2 μm at every 10 μm beginning from a 10 μm depth from the surfaces of the emitter regions 3a to 3d. Comparative Example is the same as Example in terms of the structures of the surface wiring and carrier control structure but is different in that the drift layer of Comparative Example has a single-layer structure implemented by only an n⁻-type semiconductor layer.

Figure 17:
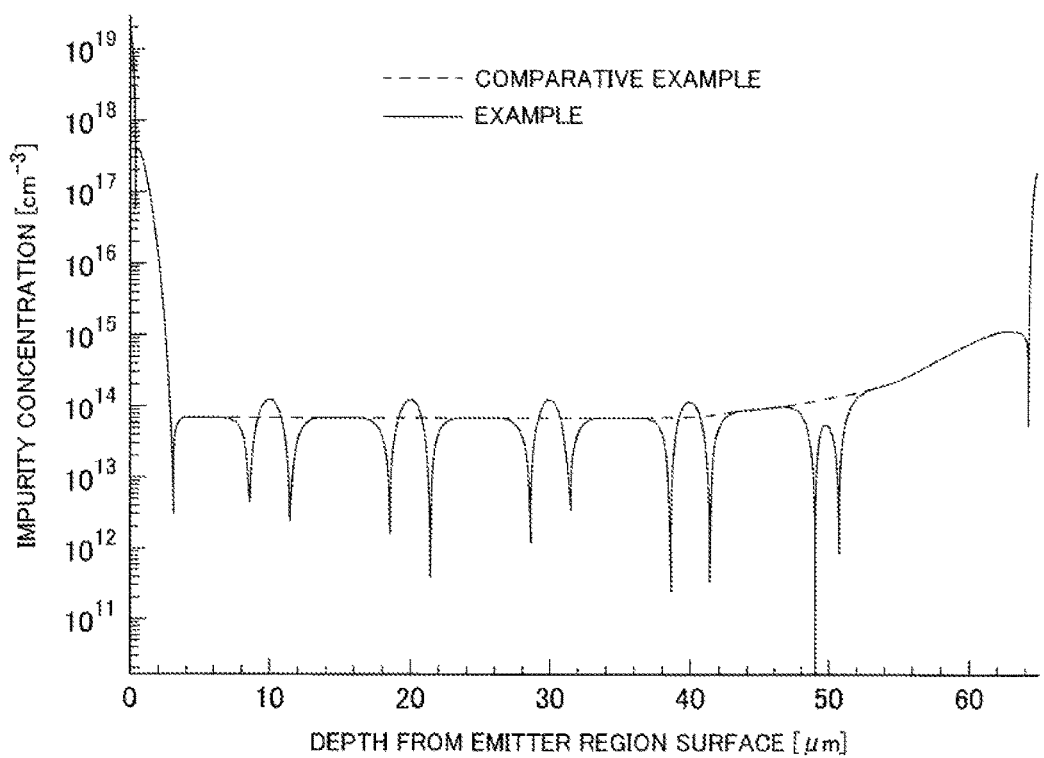
FIG. 17 is a graph illustrating the impurity concentration distribution (one-dimensional profile) of Example according to the second embodiment of the present invention.

FIG. 17 illustrates impurity concentration distributions (one-dimensional profiles) in the element region around the gate electrodes 5a and 5b in the depth direction, which are obtained by device simulation for Example and Comparative Example. In Comparative Example indicated by a dashed line in FIG. 17, the impurity concentration of the drift layer has a constant profile at about $7 \times 10^{13}$ cm⁻³. The impurity concentration distribution of Example indicated by a solid line has a profile periodically changing with peaks observed every 10 μm beginning from a 10 μm depth from the surfaces of the emitter regions 3a to 3d, corresponding to the auxiliary semiconductor layers 12a to 12e doped with an impurity concentration $2 \times 10^{14}$ cm⁻³. The impurity concentration of the auxiliary semiconductor layers 12b to 12e, other than the lowermost layer, is about $2 \times 10^{14}$ cm⁻³-$0.7 \times 10^{14}$ cm⁻³=$1.3 \times 10^{14}$ cm⁻³ by compensation with the impurity concentration of $7 \times 10^{13}$ cm⁻³ of the main semiconductor layers 11a to 11f. The auxiliary semiconductor layer 12a as the lowermost layer is influenced by the FS layer 8, which has an impurity concentration higher than that of the main semiconductor layers 11a to 11f. The impurity concentration of the auxiliary semiconductor layer 12a is lower than that of the other auxiliary semiconductor layers 12b to 12e.

FIG. 18 illustrates electron and hole density distributions (one-dimensional profiles) in the depth direction around the gate electrodes 5a and 5b, which are obtained by device simulation for Example and Comparative Example at the off-state where the collector-emitter voltage $V_{ce}$ and gate-emitter voltage $V_{ge}$ are not applied. In the profiles of Comparative Example indicated by dashed lines in FIG. 18, the distributions of electron and hole densities are substantially constant. As indicated by solid lines, the distributions of electron and hole densities of Example have pulsing profiles including substantially periodically changing portions in which the hole density becomes high at the depths corresponding to the auxiliary semiconductor layers 12a to 12e while the electron density becomes low.

Figure 19:
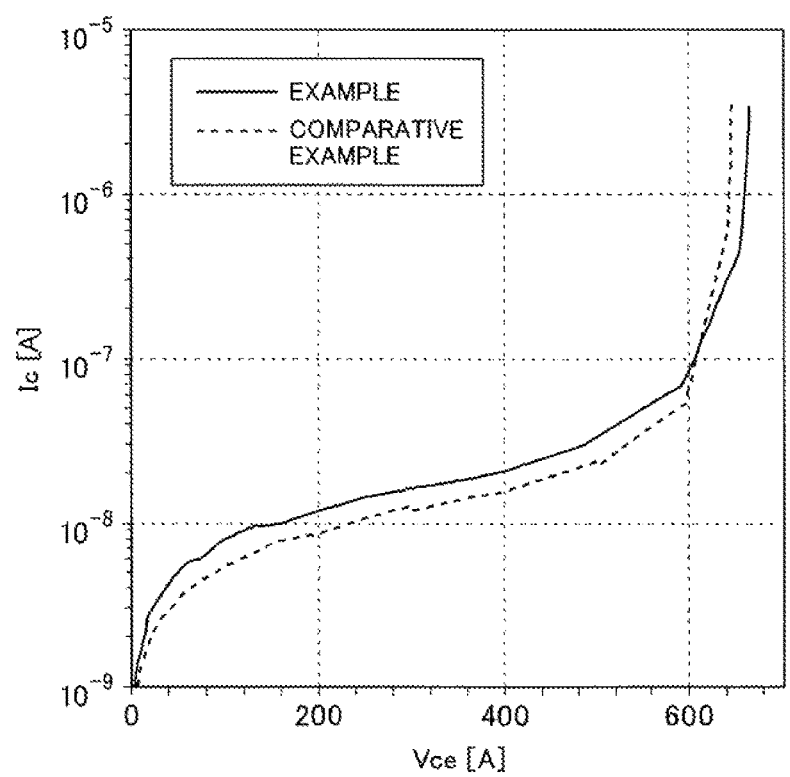
FIG. 19 is a graph comparing off-state IV characteristics of Example according to the second embodiment of the present invention with Comparative Example.

FIG. 19 illustrates breakdown voltage waveforms obtained by device simulation for Example and Comparative Example at the off-state where the gate-emitter voltage $V_{ge}$ is 0. The vertical axis represents collector current $I_c$, and the horizontal axis represents collector-emitter voltage $V_{ce}$. In Comparative Example, the breakdown voltage is about 648 V as indicated by a dashed line in FIG. 19. In Example, the breakdown voltage is about 671 V as indicated by a solid line. The breakdown voltage is improved by about 23 V.

Figure 20:
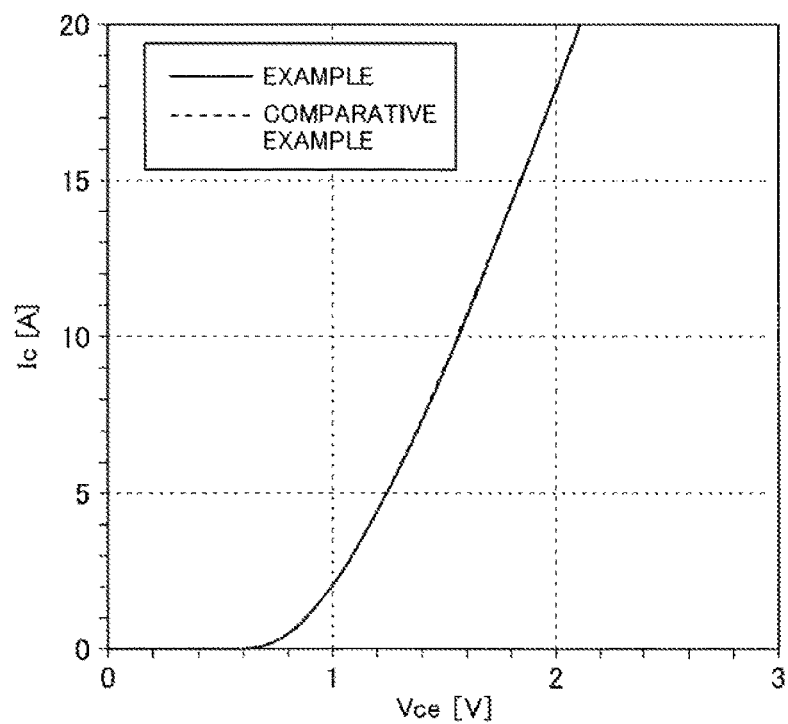
FIG. 20 is a graph comparing the IV waveform of on-state-voltage of Example according to the second embodiment of the present invention when $I_c=20$ A, with Comparative Example.

FIG. 20 illustrates IV waveforms of on-state-voltage which are obtained by device simulation for Example and Comparative Example when the gate-emitter voltage $V_{ge}$ is 15 V. The vertical axis of FIG. 20 represents collector current $I_c$, and the horizontal axis represents collector-emitter voltage $V_{ce}$. As illustrated in FIG. 20, on-state-voltages of Example and Comparative Example with the collector current $I_c$ set to 20 A are both 2.1 V, which are equal to each other.

Figure 21:
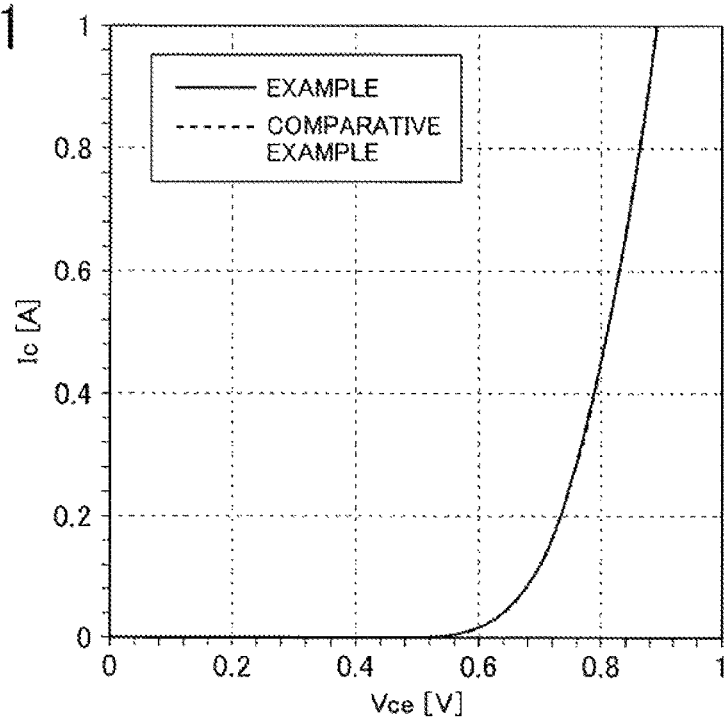
FIG. 21 is a graph comparing the IV waveform of on-state-voltage of Example according to the second embodiment of the present invention when $I_c=1$ A, with that of Comparative Example.

FIG. 21 illustrates IV waveforms of on-state-voltage in a low-current region, which are obtained by device simulation for Example and Comparative Example when the gate-emitter voltage $V_{ge}$ is 15 V. The vertical axis of FIG. 21 represents collector current $I_c$, and the horizontal axis represents collector-emitter voltage $V_{ce}$. As illustrated in FIG. 21, on-state-voltages of Example and Comparative Example with the collector current $I_c$ set to 1 A are 0.9 V, which are equal to each other.

Figure 22:
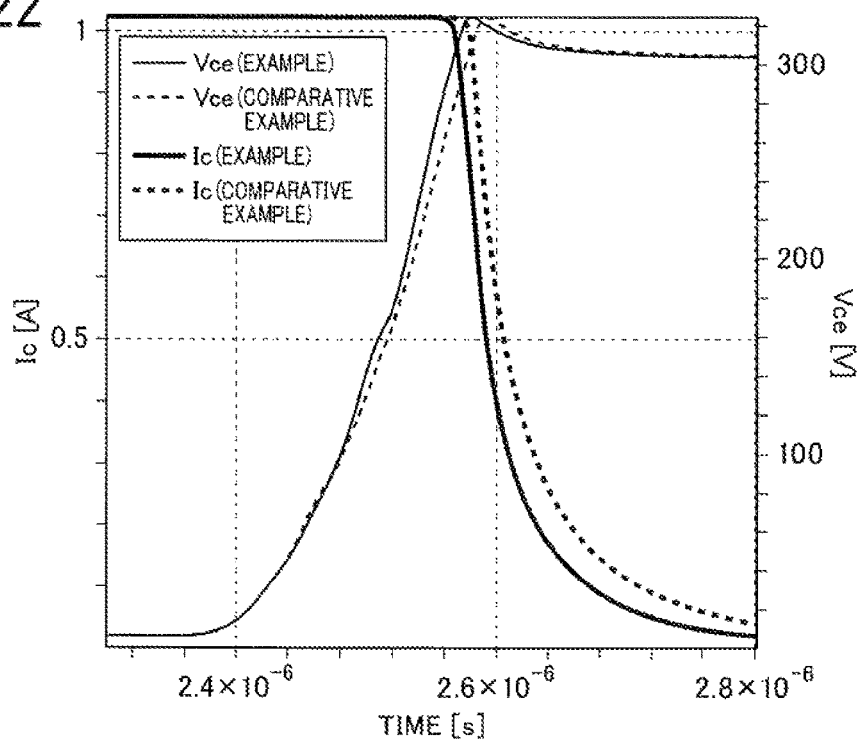
FIG. 22 is a graph comparing withstand waveforms of Example according to the second embodiment of the present invention at turn off, with Comparative Example.

FIG. 22 illustrates turn-off waveforms which are obtained by device simulation for Example and Comparative Example. In FIG. 22, the thin solid line indicates the collector-emitter voltages $V_{ce}$ of Example while the thin dashed line indicates the collector-emitter voltages Vce of Comparative Example. The thick solid line indicates the collector current $I_c$ of Example while the thick dashed line indicates the collector current $I_c$ of Comparative Example. FIG. 22 illustrates that the rise time of Example indicated by the solid line is shorter than that of Comparative Example indicated by the dashed line. The turn-off power loss of the example is 41.9 mJ while the turn-off power loss of the comparative example is 46.9 mJ. The turn-off power loss is decreased by about 10%.

As described above, with the semiconductor device according to the second embodiment, the drift layer 1 includes a stacked structure including the plurality of n⁻-type main semiconductor layers 11a to 11f and the p-type auxiliary semiconductor layers 12a to 12e sandwiched between the n⁻-type main semiconductor layers 11a to 11f. This can shorten the turn-off time and decrease the turn-off power loss, while preventing the increase of the on-state-voltage. Moreover, the breakdown voltage can be improved.

<Manufacturing Method of Semiconductor Device>

Next, with reference to FIGS. 23A to 25C, an example of the method of manufacturing a semiconductor device according to the second embodiment of the present invention will be explained. The method of manufacturing a semiconductor device described below is just an example. It is obvious that the present invention can be implemented by other various manufacturing methods including the modifications without departing from the scope of the claims.

Figure 23A:
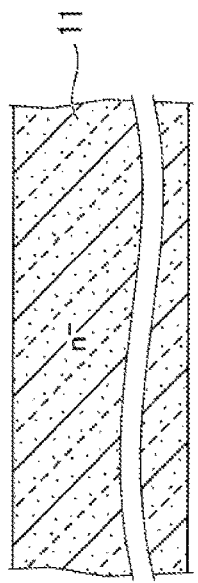
FIGS. 23A to 23C are cross-sectional process views for explaining an example of a method of manufacturing a semiconductor device according to the second embodiment of the present invention.
Figure 23B:
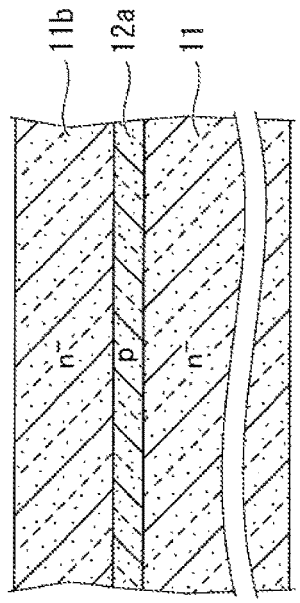
Figure 23C:
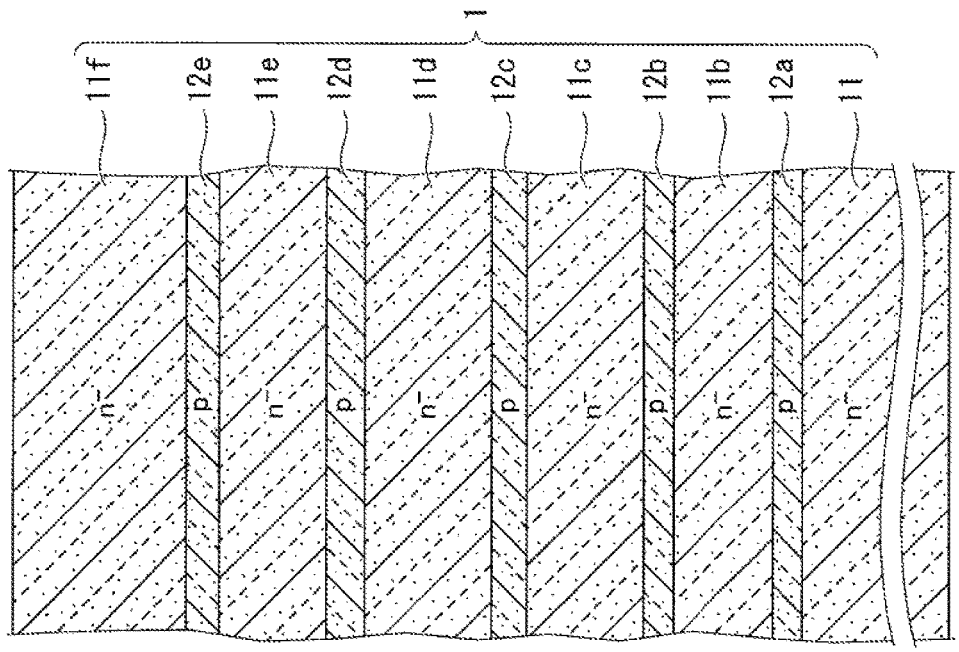

(a) As illustrated in FIG. 23A, an n⁻-type semiconductor substrate 11 is prepared, which is made by a single crystal Si or the like and has an impurity concentration of about $7 \times 10^{13}$ cm⁻³. In the surface of the semiconductor substrate 11, p-type impurity ions, such as boron (B) ions, are implanted with a dose amount such that the established impurity concentration can be about $2 \times 10^{14}$ cm⁻³ after activation. Thereafter, as illustrated in FIG. 23B, on the semiconductor substrate 11, an n⁻-type main semiconductor layer 11b with an impurity concentration of $7 \times 10^{13}$ cm⁻³ is epitaxially grown to a thickness of about 10 μm. The p-type impurity ions implanted in the surface of the semiconductor substrate 11 are activated due to heat treatment at the epitaxial growth of the main semiconductor layer 11b, a part of the activated p-type impurity ions are compensated by the n-type impurity atoms of the epitaxially grown layer. As a result, the p-type auxiliary semiconductor layer 12a with an impurity concentration of about $1.3 \times 10^{13}$ cm⁻³ is formed to a thickness of about 2 μm between the semiconductor substrate 11 and the main semiconductor layer 11b. The ion implantation and epitaxial growth are then repeated in the same way as the process of forming the auxiliary semiconductor layer 12a and main semiconductor layer lib. As illustrated in FIG. 23C, the p-type auxiliary semiconductor layer 12b and n⁻-type main semiconductor layer 11c, the p-type auxiliary semiconductor layer 12c and n⁻-type main semiconductor layer 11d, the p-type auxiliary semiconductor layer 12d and n⁻ type main semiconductor layer 11e, and the p-type auxiliary semiconductor layer 12e and n⁻-type main semiconductor layer 11f are sequentially formed. In other words, the p-type auxiliary semiconductor layers 12a to 12e with a thickness of 2 μm are included within the respective 10 μm thick epitaxial layers. The drift layer 1 is thus formed.

(b) Next, p-type impurity ions, such as B ions, are implanted in the surface of the n⁻-type main semiconductor layer 11f, which is the uppermost layer of the drift layer 1, with a predetermined projected range. Thereafter, heat treatment is performed to activate the implanted ions, forming a p-type base region 2 as illustrated in an enlarged view of upper part of the semiconductor device in FIG. 24A. The p-type base region 2 has an impurity concentration of $1\times10^{15}$ cm$^{-3}$ to $1\times10^{17}$ cm$^{-3}$, for example. Instead of forming the base region 2 by ion implantation, the base region 2 may be epitaxially grown on the top surface of the main semiconductor layer 11f.

Figure 24A:
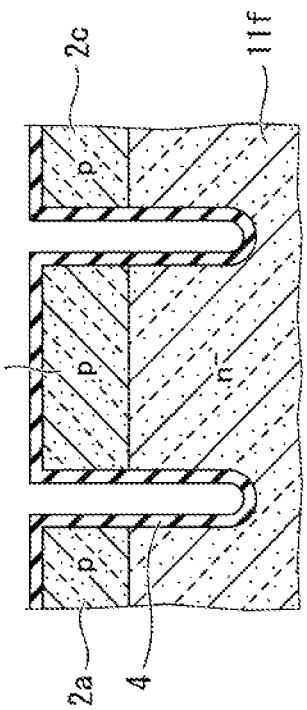
FIGS. 24A to 24D are cross-sectional process views subsequent to FIGS. 23A to 23C for explaining the example of the method of manufacturing a semiconductor device according to the second embodiment of the present invention.
Figure 24B:
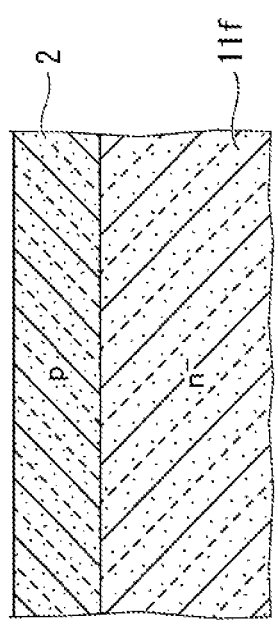

(c) Next, a photoresist film 21 is coated onto the base region 2 and is then delineated by photolithography. Using the delineated photoresist film 21 as a mask, recesses (trenches) 2x and 2y, which penetrate the base region 2 and reach upper part of the drift layer 1, are selectively formed as illustrated in FIG. 24B by dry etching such as reactive ion etching (RIE). The photoresist film 21 is then removed by oxygen (O₂) plasma or the like. The trenches 2x and 2y, which reach upper part of the drift layer 1, may be also formed in the following manner. First, an oxide film is formed on the drift layer 1 and is delineated using the photoresist film 21, and then dry etching is performed using the delineated oxide film as a mask.

Figure 24C:
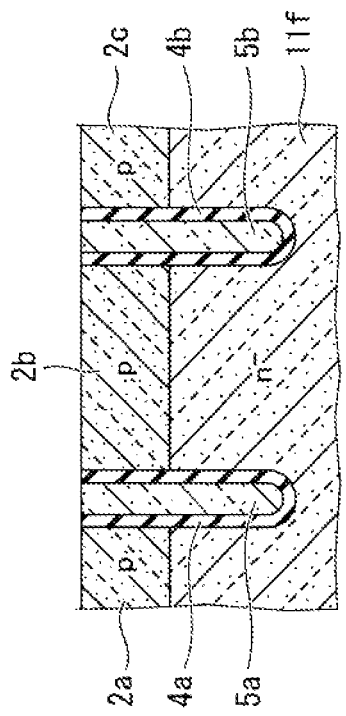
Figure 24D:
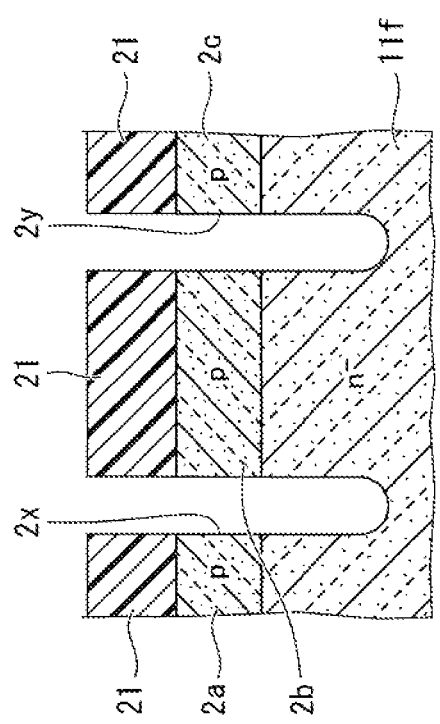

(d) Next, a gate insulating film 4 made by silicon oxide film (SiO₂ film) is formed on the base regions 2a to 2c and the inner surfaces of the trenches 2x and 2y by thermal oxidation or the like as illustrated in FIG. 24C. On the gate insulating film 4, a polysilicon layer (a doped polysilicon layer) doped with n-type impurity ions is deposited by chemical vapor-phase deposition (CVD) or the like. The polysilicon layer is etched back so that polysilicon layers 5a and 5c be buried in the trenches 2x and 2y through the gate insulating films 4a and 4b, respectively. Using the etching selection ratio of the oxide film and polysilicon, the gate insulating film 4 is selectively removed by dry etching or the like so as to expose the top surfaces of the base regions 2a to 2c as illustrated in FIG. 24D.

Figure 25C:
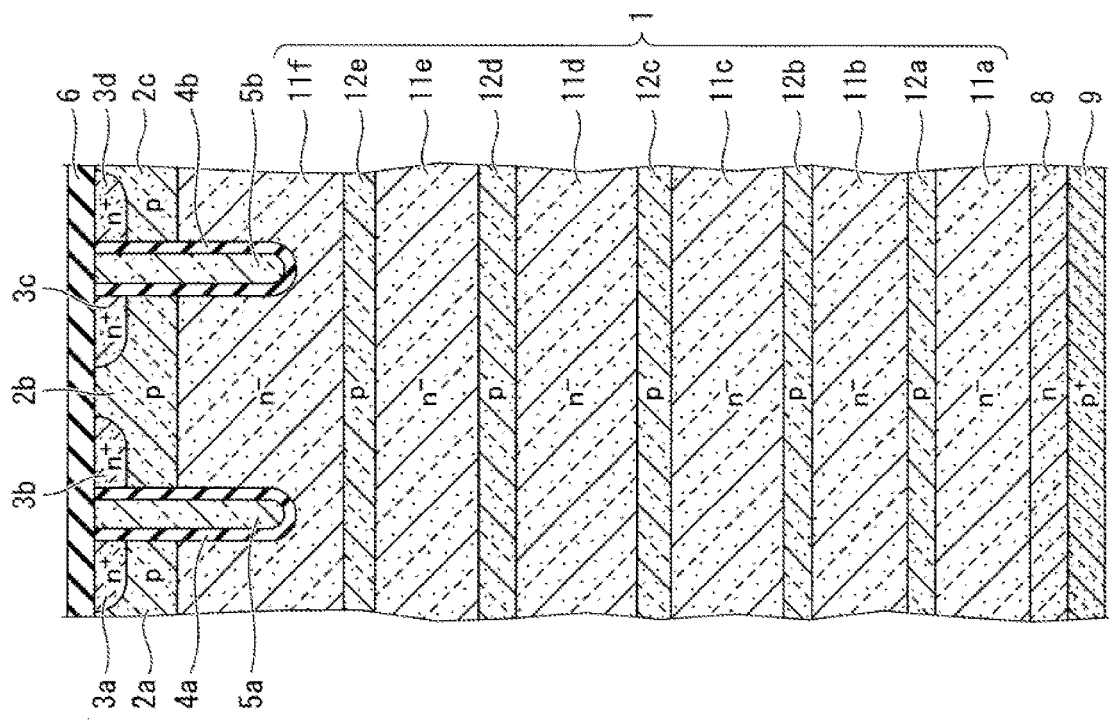
FIGS. 25A to 25C are cross-sectional process views subsequent to FIGS. 24A to 24D for explaining the example of the method of manufacturing a semiconductor device according to the second embodiment of the present invention.
Figure 25A:
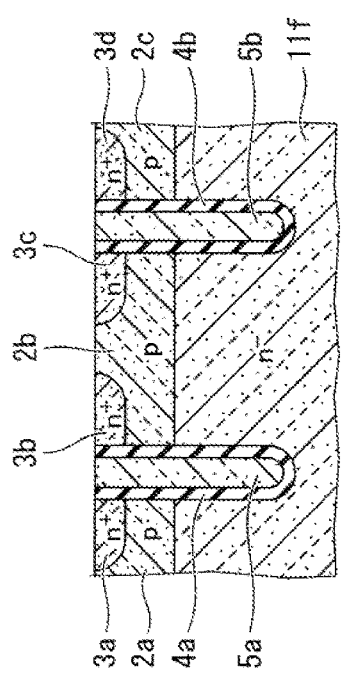
Figure 25B:
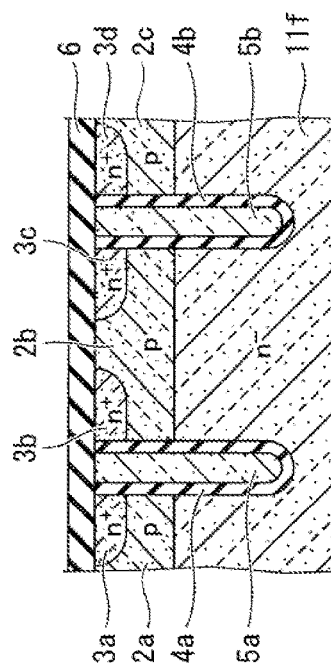

(e) Next, photoresist film (not illustrated) is coated onto the base regions 2a to 2c and is delineated by photolithography. Using the delineated photoresist film as a mask, n-type impurity ions, such as As or P ions, are implanted. The ions are also implanted into the polysilicon layers 5a and 5b simultaneously. The photoresist film is removed by O₂ plasma or the like. Subsequent heat treatment activates the implanted ions. As illustrated in FIG. 25A, the n⁺-type emitter regions 3a to 3d with an impurity concentration of about $5\times10^{19}$ cm$^{-3}$ to $1\times10^{21}$ cm$^{-3}$, for example, are thus selectively formed in upper part of the base regions 2a to 2c. In the process of heating the emitter regions 3a to 3d, the ions implanted into the polysilicon layers 5a and 5b are also activated. Moreover, as illustrated in FIG. 25B, an interlayer insulating film 6 made by SiO₂ film or the like is deposited by CVD or the like on the gate electrodes 5a and 5b, the emitter regions 3a to 3d, and the base regions 2a to 2c.

(f) Next, the bottom surface of the semiconductor substrate 11 is polished (or ground if necessary) and etched for adjustment of the thickness. After the adjustment of thickness, n-type and p-type impurity ions are sequentially implanted to the bottom surface of the semiconductor substrate 11 with a predetermined projected range. Thereafter, heat treatment is performed to activate the implanted ions. As illustrated in FIG. 25C, the n-type FS layer 8 and the p⁺-type collector region 9 with an impurity concentration of about $3\times10^{18}$ to $1\times10^{20}$ cm$^{-3}$, for example, are therefore formed in the bottom surface side of the semiconductor substrate 11. The residual part of the semiconductor substrate 11 is defined as the main semiconductor layer 11a.

(g) Next, photoresist film (not illustrated) is applied to the interlayer insulating film 6 and is then delineated using photolithography. Using the delineated photoresist film, the interlayer insulating film 6 is selectively removed so as to remain on the gate electrodes 5a and 5b other than gate contact hole sections by dry etching so that emitter and gate contact holes are opened. The photoresist film is then removed by O₂ plasma or the like.

(h) Next, metallic film made by Al or the like is deposited by sputtering or vacuum evaporation. Then new photoresist film is coated to the metallic film, and the emitter electrode 7 is formed on the top surfaces of the emitter regions 3a to 3d and the base regions 2a to 2c as illustrated in FIG. 14 by photolithography. The gate wiring (not illustrate) located at a rearward portion of the paper is simultaneously delineated. In a similar manner, the collector electrode 10 made by Au or the like is formed on the bottom surface of the collector region 9 by sputtering, vacuum evaporation, or the like. If necessary, the bottom surface of the drift layer 1 is irradiated with electron beams or protons. This can generate crystalline defects for controlling the lifetime of carriers in the drift layer 1. Then heat treatment is performed to recover the crystalline defects unstable in energy. The semiconductor device according to the second embodiment of the present invention is thus completed.

With the method of manufacturing a semiconductor device according to the second embodiment of the present invention, it is possible to manufacture a semiconductor device having a decreased turn-off power loss, while preventing the increase of the on-state-voltage.

In the process of forming the drift layer 1 illustrated in FIGS. 23A to 23C, the p-type auxiliary semiconductor layers 12a to 12e and n⁻-type main semiconductor layers 11b to 11f are formed by repeating implantation of the p-type impurity ions for impurity doping and epitaxial growth of the n⁻-type main semiconductor layers 11b to 11f. However, the process is not limited to the aforementioned method. For example, the conductivity types in the ion implantation and epitaxial growth may be inverted. Specifically, the p-type auxiliary semiconductor layers 12a to 12e and n⁻-type main semiconductor layers 11b to 11f may be formed by repeating epitaxial growth of the p-type auxiliary semiconductor layers 12a to 12e and ion implantation of n-type impurity ions.

When the peripheral area (edge termination area) where the guard rings 15a to 15c illustrated in FIGS. 15 and 16 are arranged does not have a high-impurity concentration, the drift layer 1 may be formed by continuous epitaxial growth with different impurity elements doped instead of ion implantation. To be specific, the drift layer 1 may be formed by alternately repeating epitaxial growth for p-type auxiliary semiconductor layers 12a to 12e and epitaxial growth for n⁻-type main semiconductor layers 11b to 11f. In this case, the FS layer 8, main semiconductor layer 11a, auxiliary semiconductor layer 12a, main semiconductor layer 11b, . . . main semiconductor layer 11f may be continuously epitaxially grown on the p⁺-type semiconductor substrate which is designed to serve as the collector region 9. Moreover, the n-type and p-type impurity ions may be doped by a diffusion technique instead of ion implantation.

Third Embodiment

<Structure of Semiconductor Device>

Figure 26:
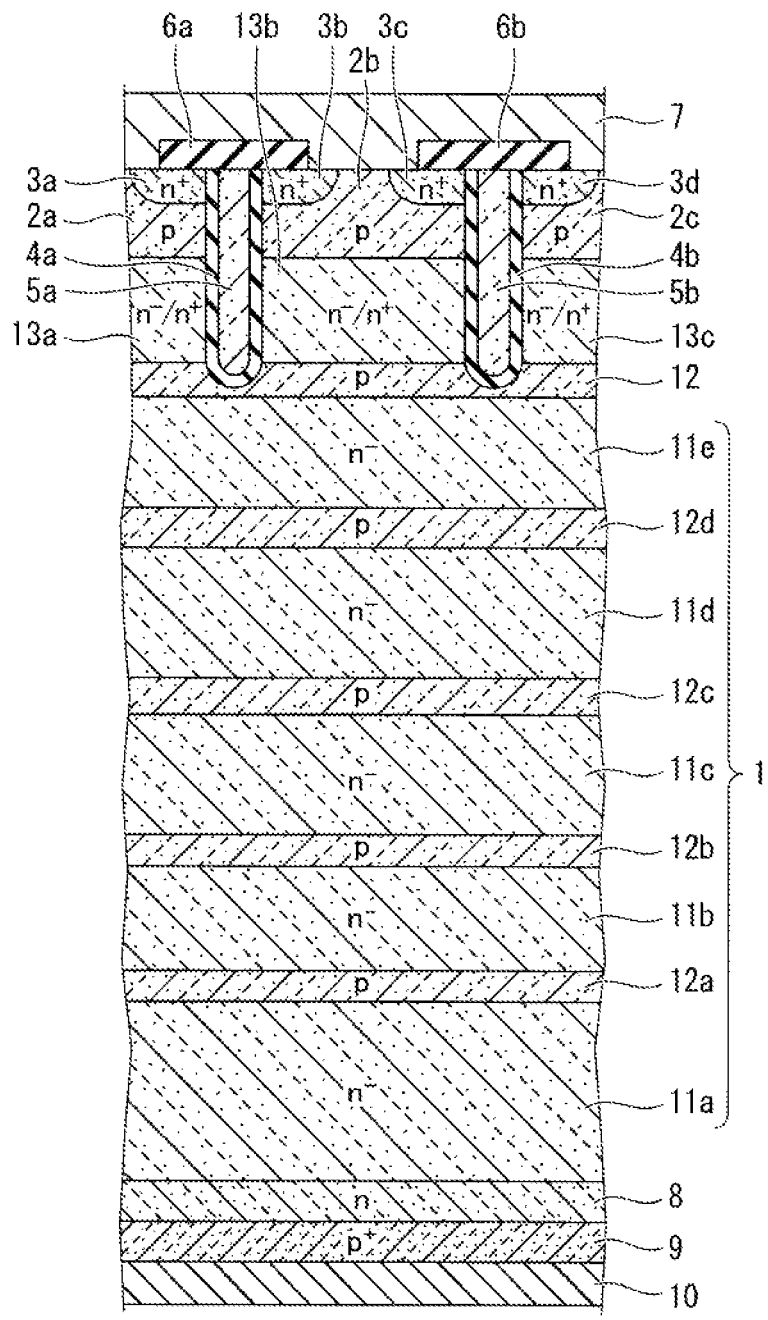
FIG. 26 is a cross-sectional view illustrating an example of the configuration of a semiconductor device according to a third embodiment of the present invention.

A semiconductor device according to a third embodiment of the present invention has a configuration different from that of the semiconductor device according to the first embodiment of the present invention illustrated in FIG. 1 in terms of the structure of the drift layer 1 as illustrated in FIG. 26. Moreover, the configuration of the semiconductor device according to the third embodiment is different from that of the semiconductor device according to the second embodiment of the present invention illustrated in FIG. 14 in including a p-type gate screening semiconductor layer 12 configured to sheathe the bottoms of the gate electrodes 5a and 5b through the gate insulating films 4a and 4b.

The drift layer 1 is delineated by a stacked structure including a plurality of n$^-$-type main semiconductor layers 11a to 11e and p-type auxiliary semiconductor layers 12a to 12d. The main semiconductor layers 11a to 11e include at least the main semiconductor layers 11a and 11e, which are located in the upper and bottom surfaces of the drift layer 1. The auxiliary semiconductor layers 12a to 12d are sandwiched between the main semiconductor layers 11a to 11e. A gate screening semiconductor layer 12 is buried in the top surface of the drift layer 1. N$^-$-type or n$^+$-type intermediate semiconductor layers 13a to 13c are buried on the top surface of the gate screening semiconductor layer 12.

The gate screening semiconductor layer 12 and the p-type auxiliary semiconductor layers 12a to 12d may be exposed in a discontinuous end face in the edge termination area A2 in a similar manner to the auxiliary semiconductor layers 12a to 12e illustrated in FIG. 15. Alternatively, the ends of the gate screening semiconductor layer 12 and the p-type auxiliary semiconductor layers 12a to 12d may be terminated by a p-type semiconductor region 16 in a similar manner to the auxiliary semiconductor layers 12a to 12e illustrated in FIG. 16.

The other configurations of the semiconductor device according to the third embodiment of the present invention are the substantially same as those of the semiconductor devices according to the first and second embodiments of the present invention, and overlapping description thereof is omitted.

Example

Next, results of device simulation for Examples A and B of the semiconductor devices according to the second and third embodiments of the present invention will be explained, compared with Comparative Example. Example A has a structure described with the semiconductor device according to the second embodiment of the present invention illustrated in FIG. 14. Example A has a multilayer stacked structure in which the p-type auxiliary semiconductor layers 12a to 12e of the drift layer 1 are established with a thickness of 2 μm at every 10 μm beginning from a 10 μm depth from the surfaces of the emitter regions 3a to 3d. Example B has a structure described with the semiconductor device according to the third embodiment of the present invention illustrated in FIG. 26. Example B has a multilayer stacked structure in which the gate screening semiconductor layer 12 and auxiliary semiconductor layers 12a to 12d are buried with a thickness of 2 μm at every 10 μm beginning from a 5 μm depth from the surfaces of the emitter regions 3a to 3d. Moreover, the gate screening semiconductor layer 12 sheathes the bottoms of the gate electrodes 5a and 5b through the gate insulating films 4a and 4b. Comparative Example is the same as Examples A and B in terms of the structures of the surface wiring and carrier control structure but is different in that the drift layer of Comparative Example has a single-layer structure implemented by only an n$^-$-type semiconductor layer.

Figure 27:
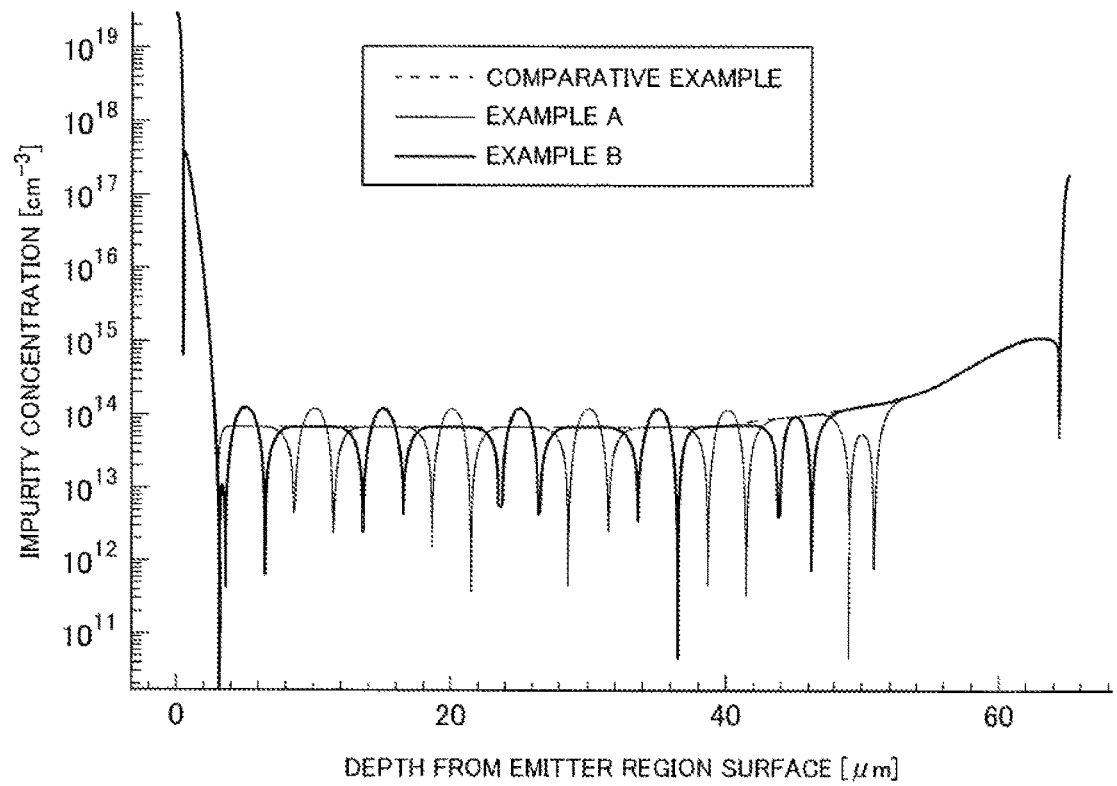
FIG. 27 is a graph comparing impurity concentration distributions (one-dimensional profiles) of Examples according to the second and third embodiments of the present invention with Comparative Example.

FIG. 27 illustrates impurity concentration distributions (one-dimensional profiles) in the element region around the gate electrodes 5a and 5b in the depth direction, which are obtained by device simulation for Examples A and B and Comparative Example. In the profile of Comparative Example indicated by a dashed line in FIG. 27, the impurity concentration in the drift layer is constant at about $7 \times 10^{13}$ cm$^{-3}$. In the profiles of Example A indicated by a thin solid line and Example B indicated by a thick solid line, peaks corresponding to the auxiliary semiconductor layers 12a to 12e of Example A doped with an impurity concentration $2 \times 10^{14}$ cm$^{-3}$ and peaks corresponding to the gate screening semiconductor layer 12 and auxiliary semiconductor layers 12a to 12d of Example B are alternately observed. The impurity concentration of the auxiliary semiconductor layers 12b to 12e of Example A and the impurity concentration of the gate screening semiconductor layer 12 and auxiliary semiconductor layers 12a to 12d of Example B are about $2 \times 10^{14}$ cm$^{-3}$-$0.7 \times 10^{14}$ cm$^{-3}$=$1.3 \times 10^{14}$ cm$^{-3}$ by compensation with the impurity concentration of $7 \times 10^{13}$ cm$^{-3}$ of the main semiconductor layers 11a to 11f.

Figure 28:
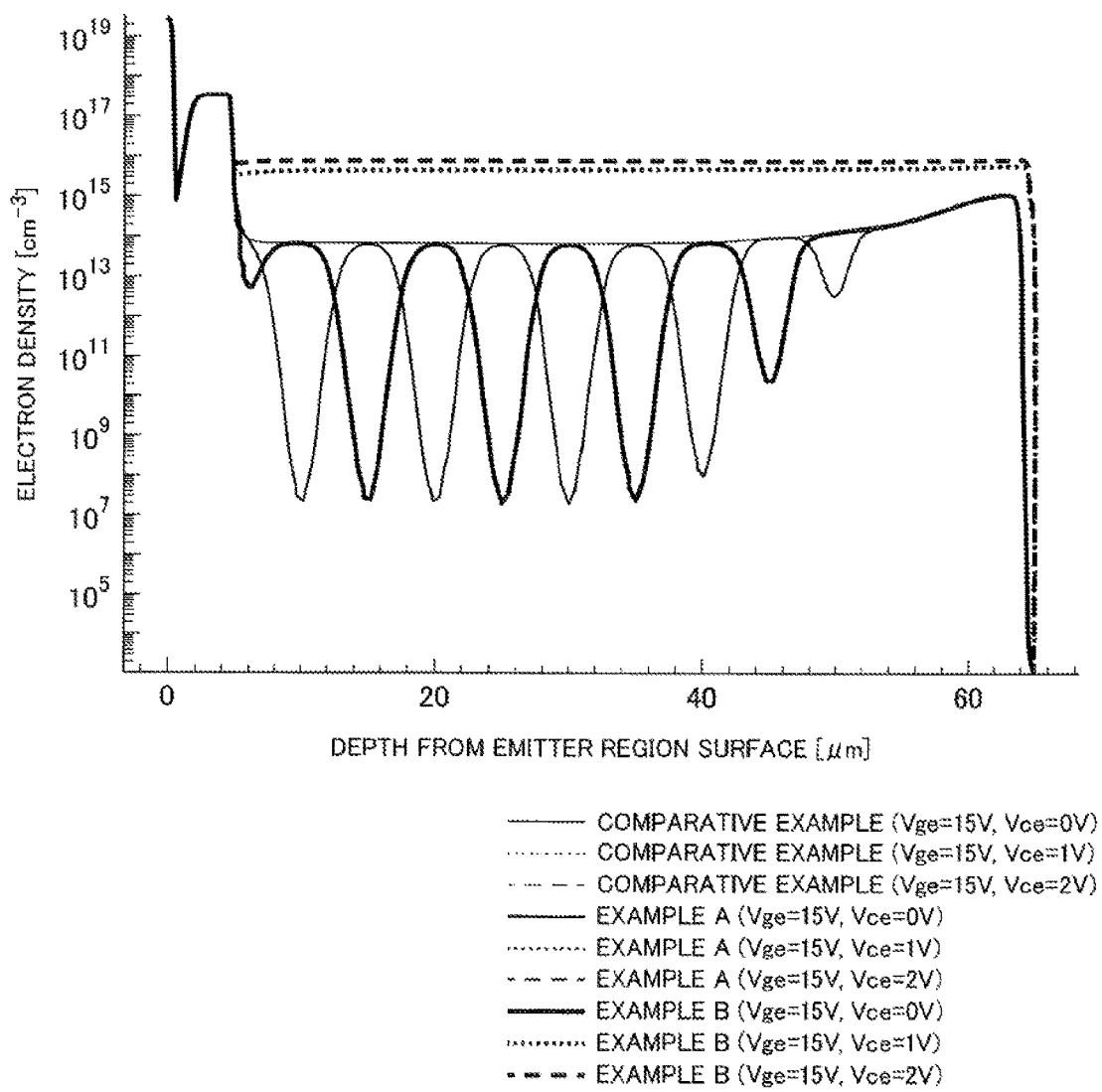
FIG. 28 is a graph comparing electron density distributions (one-dimensional profiles) of Examples according to the second and third embodiments of the present invention with Comparative Example.
Figure 29:
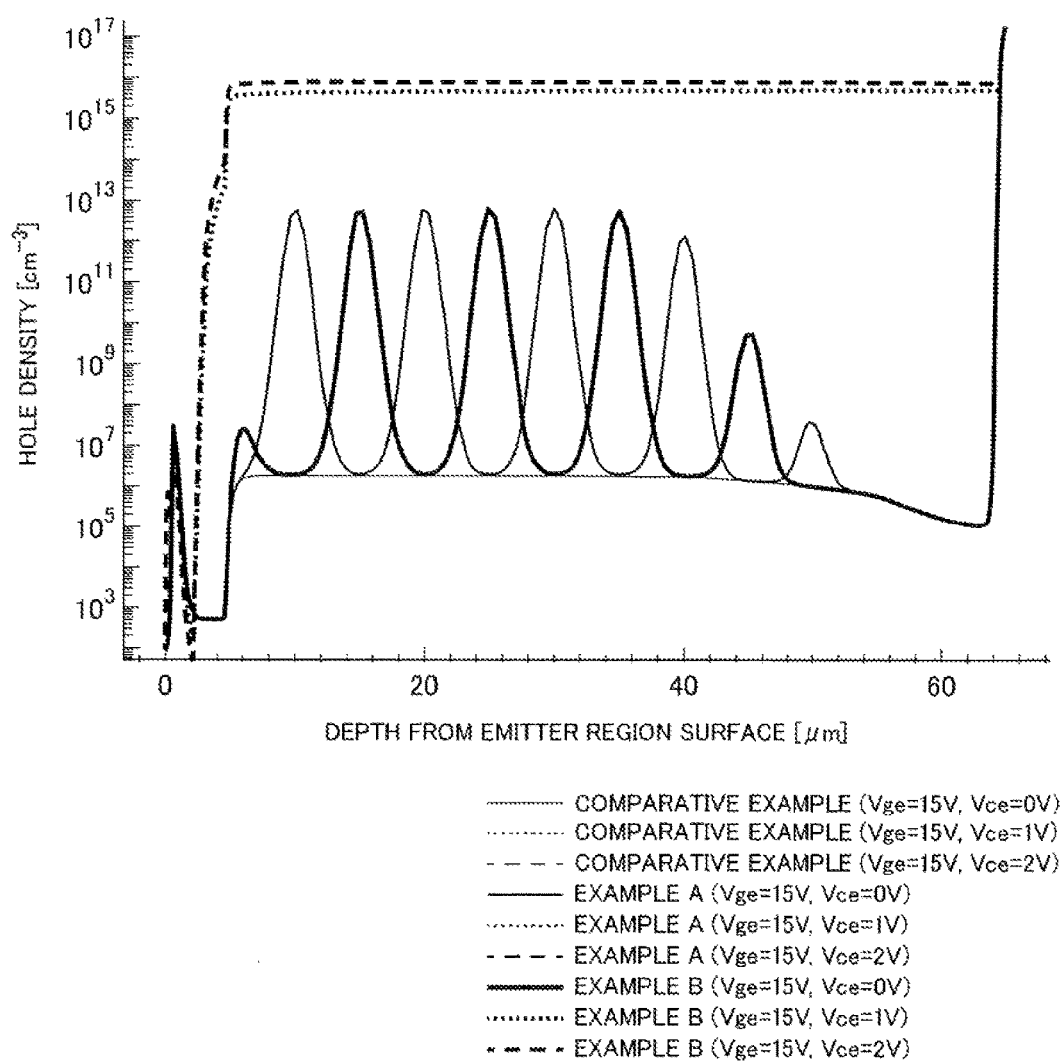
FIG. 29 is a graph comparing hole density distributions (one-dimensional profiles) of Examples according to the second and third embodiments of the present invention with Comparative Example.

FIGS. 28 and 29 illustrate electron and hole density distributions (one-dimensional profile), which are obtained by device simulation for Examples A and B and Comparative Example at every 1 V of the collector-emitter voltage $V_{ce}$ varied from 0 V to 2 V at the on-state where the gate-emitter voltage $V_{ge}$ is 15 V. As illustrated in FIGS. 28 and 29, when the collector-emitter voltage $V_{ce}$ is 0 V, the electron and hole density distributions of Examples A and B are influenced by the p-type gate screening semiconductor layer 12 and auxiliary semiconductor layers 12a to 12e. When current flows at a collector-emitter voltage $V_{ce}$ of not less than 1 V, the electron and hole density distributions of Examples A and B are equal to those of Comparative Example.

With the semiconductor device according to the third embodiment of the present invention, the gate screening semiconductor layer 12 is uniformly buried along the main surface of the drift layer 1, and the drift layer 1 is implemented by the stacked structure including the plurality of n$^-$-type main semiconductor layers 11a to 11e and the p-type auxiliary semiconductor layers 12a to 12d sandwiched between the plurality of main semiconductor layers 11a to 11e. This can decrease the turn-off power loss, while preventing the increase of the on-state-voltage, and moreover improve the breakdown voltage.

Moreover, inclusion of the gate screening semiconductor layer 12 configured to sheathe the bottoms of the plurality of trenches can relax the electric field at the bottoms of the plurality of trenches. This can suppress a rise in gate voltage at switching, therefore increasing the switching speed.

The drift layer 1 of each semiconductor device according to the first to fifth modifications of the first embodiment of the present invention illustrated in FIGS. 5, 8 to 13 may be include a stacked structure including the plurality of n$^-$-type main semiconductor layers 11a to 11e and the p-type auxiliary semiconductor layers 12a to 12d sandwiched between the plurality of main semiconductor layers 11a to 11e.

<Manufacturing Method of Semiconductor Device>

As an example of a method of manufacturing a semiconductor device according to the third embodiment of the present invention, the gate screening semiconductor layer 12 is formed as illustrated in FIG. 2B after the n⁻-type main semiconductor layer 11e is formed in the process of forming the drift layer 1 illustrated in FIGS. 23A to 23C in the method of manufacturing a semiconductor device according to the second embodiment of the present invention. The subsequent procedure is the same as that of the first embodiment of the present invention, and overlapping description is omitted.

Other Embodiments

The present invention is described using the first to third embodiments. However, it should not be understood that the description and drawings constituting a part of the disclosure will limit the present invention. Those skilled in the art will know various substitutions, examples, and operation techniques from the disclosure.

For example, in the second embodiment, a vertical IGBT with the trench gate structure is explained. However, the present invention is applicable to vertical IBGTs with the planer gate structure in addition to vertical IBGTs with the trench gate structure. Moreover, the carrier control structure of the semiconductor device of the present invention is not limited to the semiconductor device including an insulating gate structure described in the second embodiment by way of example. For example, the structure of the drift layer 1 of the present invention is applicable to various types of semiconductor devices including carrier control structures configured to control the transportation of carriers through a junction gate structure (buried gate structure), such as an SI thyristor and GTO, for example. Moreover, the present invention is applicable to a semiconductor device including a second gate structure near the second main electrode region within the drift layer 1, such as a double-gate SI thyristor.

In the second and third embodiments, at least some of the p-type auxiliary semiconductor layers 12a to 12e are unnecessarily implemented by a strictly continuous single layer. Each of the p-type auxiliary semiconductor layers 12a to 12e only needs to include an impurity distribution that provides a uniform potential profile in the direction orthogonal to the direction of main current flowing through the drift layer 1 in the element region (active area) during zero-bias where no voltage is applied to the gate or collector. Accordingly, the p-type auxiliary semiconductor layers 12a to 12e only need to implement such a uniform potential profile during zero bias that the potential is constant in the direction orthogonal to the direction of the main current. This can be implemented by a topology including a pattern of a stripe structure or an island structure repeatedly provided with gap not more than a device length, for example.

As described above, it is obvious that the present invention includes various embodiments and the like not described herein. Accordingly, the technical scope of the present invention should be defined by only subject matter of claims appropriate from the above description.

What is claimed is:

1. A semiconductor device, comprising:
   a drift layer of a first conductivity type, implementing a main semiconductor layer;
   a base region of a second conductivity type provided on a top surface side of the drift layer;
   a first main electrode region of the first conductivity type provided in an upper part of the base region, having an impurity concentration higher than the main semiconductor layer;
   a gate insulating film buried in a trench penetrating the first main electrode region and the base region;
   a gate electrode buried in the trench through the gate insulating film;
   a gate screening semiconductor layer of the second conductivity type, being buried under a bottom of the trench so as to integrally surround bottoms of trenches adjacent to each other;
   an intermediate semiconductor layer of the first conductivity type sandwiched between the base region and the gate screening semiconductor layer;
   a second main electrode region of the second conductivity type provided on a bottom surface side of the drift layer; and
   a mesa region of the second conductivity type, in direct contact with the gate screening semiconductor layer, and provided in a region sandwiched between the trenches adjacent to each other.

2. The semiconductor device of claim 1, wherein the drift layer is implemented by a stacked structure, the stacked structure includes:
   a plurality of main semiconductor layers of the first conductivity type located at least in upper and bottom surfaces of the drift layer; and
   an auxiliary semiconductor layer of the second conductivity type sandwiched between the plurality of main semiconductor layers.

3. The semiconductor device of claim 2, wherein the auxiliary semiconductor layer includes a plurality of auxiliary semiconductor layers, and the plurality of auxiliary semiconductor layers and the plurality of main semiconductor layers are alternately stacked.

4. The semiconductor device of claim 2, wherein the auxiliary semiconductor layer extends to an edge termination area in a periphery of an element area.

5. The semiconductor device of claim 1, wherein the mesa region contacts facing sides of the trenches adjacent to each other.

6. A semiconductor device, comprising:
   a drift layer of a first conductivity type, implementing a main seminconductor layer;
   a base region of a second conductivity type provided on a top surface side of the drift layer;
   a first main electrode region of the first conductivity type provided in an upper part of the base region, having an impurity concentration higher than the main semiconductor layer;
   a gate insulating film buried in a trench penetrating the first main electrode region and the base region;
   a gate electrode buried in the trench through the gate insulating film;
   a gate screening semiconductor layer of the second conductivity type, being buried under a bottom of the trench so as to integrally surround bottoms of trenches adjacent to each other;
   an intermediate semiconductor layer of the first conductivity type sandwiched between the base region and the gate screening semiconductor layer;
   a second main electrode region of the second conductivity type provided on a bottom surface side of the drift layer; and
   a mesa region of the second conductivity type, in contact with the gate screening semiconductor layer, and provided in a region sandwiched between the trenches adjacent to each other, wherein the gate screening semiconductor layer includes:
a flat layer of the second conductivity type uniformly provided along a main surface of the drift layer so as to separate from the trench in a depth direction; and
a plurality of bridge layers of the second conductivity type which are in contact with the flat layer and are separated from each other to sheathe the respective bottoms of the trenches adjacent to each other.

7. A semiconductor device, comprising:
a drift layer implemented by a stacked structure including a plurality of main semiconductor layers of a first conductivity type located at least in upper and bottom surfaces of the drift layer, and an auxiliary semiconductor layer of a second conductivity sandwiched between the plurality of main semiconductor layers;
a first main electrode region of the first conductivity type provided on a top surface side of the drift layer and having an impurity concentration higher than the main semiconductor layers;
a second main electrode region of the second conductivity type provided on a bottom surface side of the drift layer; and
a carrier control structure configured to control movement of carriers being transported in the drift layer,
wherein the plurality of main semiconductor layers and the auxiliary semiconductor layer are stacked with each other in a depth direction from a surface of the first main electrode region.

8. A method of manufacturing a semiconductor device, comprising:
forming a base region of a second conductivity type on a top surface side of a drift layer including a main semiconductor layer of a first conductivity type;
forming a first main electrode region of the first conductivity type in an upper part of the base region, the first main electrode region having an impurity concentration higher than the main semiconductor layer;
digging a trench penetrating the first main electrode region and the base region;
forming a gate insulating film in the trench;
burying a gate electrode in the trench through the gate insulating film;
forming a gate screening semiconductor layer of the second conductivity type so as to be buried under a bottom of the trench and so as to integrally surround bottoms of trenches adjacent to each other;
forming an intermediate semiconductor layer of the first conductivity type sandwiched between the base region and the gate screening semiconductor layer;
forming a second main electrode region of the second conductivity type on a bottom surface side of the drift layer; and
forming a mesa region of the second conductivity type to be in direct contact with the gate screening semiconductor layer and to be provided in a region sandwiched between the trenches adjacent to each other.

9. The method of claim 8, wherein forming the gate screening semiconductor layer comprises:
epitaxially growing the gate screening semiconductor layer on the drift layer.

10. The method of claim 8, wherein forming the gate screening semiconductor layer comprises:
ion implanting impurity ions of the second conductivity type at the projection range of the bottom of the trench; and
annealing the main semiconductor layer so as to active the implanted impurity ions.

11. The method of claim 8, wherein forming the gate screening semiconductor layer comprises:
uniformly forming a flat layer of the second conductivity type along the main surface of the drift layer so as to separate from the trenches in the depth direction; and
forming a plurality of bridge layers of the second conductivity type which are in contact with the flat layer and are separated from each other to sheathe the bottoms of the trenches adjacent to each other.

12. The method of claim 8, wherein forming the drift layer comprises:
sandwiching an auxiliary semiconductor layer of a second conductivity between a plurality of main semiconductor layers of a first conductivity type to form a drift layer implemented by a stacked structure including the plurality of main semiconductor layers and the auxiliary semiconductor layer, the plurality of main semiconductor layers located at least in upper and bottom surfaces of the drift layer.

13. The method of claim 12, wherein forming the drift layer comprises:
forming the auxiliary semiconductor layer and the plurality of main semiconductor layers by repeatedly processes, each of the processes comprising ion implantation for impurity doping and epitaxial growth.

14. The method of claim 12, wherein forming the drift layer comprises:
continuously and alternately performing different epitaxial growth for doping impurity elements of opposite conductivity type so as to form the plurality the of main semiconductor layers and the auxiliary semiconductor layer sandwiched between the main semiconductor layers, sequentially.

15. A method of manufacturing a semiconductor device, comprising:
sandwiching an auxiliary semiconductor layer of a second conductivity type between a plurality of main semiconductor layers of a first conductivity type to form a drift layer implemented by a stacked structure including the plurality of main semiconductor layers and the auxiliary semiconductor layer, the plurality of main semiconductor layers located at least in upper and bottom surfaces of the drift layer;
forming a first main electrode region of the first conductivity type on a top surface side of the drift layer, the first main electrode region having an impurity concentration higher than the plurality of main semiconductor layers;
forming a carrier control structure configured to control movement of carriers being transported in the drift layer; and
forming a second main electrode region of the second conductivity type on a bottom surface side of the drift layer,
wherein the plurality of main semiconductor layers and the auxiliary semiconductor layer are stacked with each other in a depth direction from a surface of the first main electrode region.

* * * * *

UNITED STATES PATENT AND TRADEMARK OFFICE
CERTIFICATE OF CORRECTION

PATENT NO. : 10,468,510 B2
APPLICATION NO. : 15/206884
DATED : November 5, 2019
INVENTOR(S) : Mutsumi Kitamura Page 1 of 1

It is certified that error appears in the above-identified patent and that said Letters Patent is hereby corrected as shown below:

In the Claims

Column 24, Line 41 (approx.):
In Claim 6, delete "seminconductor" and insert -- semiconductor --, therefor.

Column 25, Line 19:
In Claim 7, after "higher than the" insert -- plurality of --.

Column 26, Line 35 (approx.):
In Claim 14, delete "the of" and insert -- of --, therefor.

Signed and Sealed this
Seventh Day of January, 2020

Andrei Iancu
*Director of the United States Patent and Trademark Office*